(12) United States Patent
Kajimoto

(10) Patent No.: US 6,998,879 B2
(45) Date of Patent: Feb. 14, 2006

(54) LEVEL DETERMINATION CIRCUIT DETERMINING LOGIC LEVEL OF INPUT SIGNAL

(75) Inventor: Takeshi Kajimoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/394,276

(22) Filed: Mar. 24, 2003

(65) Prior Publication Data
US 2004/0085098 A1    May 6, 2004

(30) Foreign Application Priority Data
Oct. 31, 2002 (JP) .............................. 2002-318054

(51) Int. Cl.
H03K 5/22 (2006.01)
(52) U.S. Cl. .......................... 327/73; 327/87
(58) Field of Classification Search ........... 327/77–80, 327/87, 88, 540–543, 563, 73; 365/184, 365/185.2, 185.24
See application file for complete search history.

(56) References Cited

U.S. PATENT DOCUMENTS

| | | | | |
|---|---|---|---|---|
| 5,321,653 A | * | 6/1994 | Suh et al. .............. | 365/189.09 |
| 5,677,643 A | * | 10/1997 | Tomita ..................... | 327/78 |
| 5,867,047 A | * | 2/1999 | Kraus ....................... | 327/143 |
| 6,160,423 A |  | 12/2000 | Haq ............................ | 327/41 |
| 6,255,859 B1 |  | 7/2001 | Haq ............................ | 327/14 |
| 6,275,959 B1 |  | 8/2001 | Ransijn .................... | 714/705 |
| 6,297,671 B1 | * | 10/2001 | Shih et al. ................ | 327/74 |
| 6,317,369 B1 |  | 11/2001 | Kubo et al. ............. | 365/193 |
| 6,614,270 B1 | * | 9/2003 | Okamoto et al. ......... | 327/77 |
| 2003/0001644 A1 | * | 1/2003 | Chao et al. .............. | 327/206 |

FOREIGN PATENT DOCUMENTS

| | | |
|---|---|---|
| DE | 199-46-757 A1 | 4/2000 |
| JP | 09-270700 | 10/1997 |
| KR | 1999-0081046 | 11/1999 |
| KR | 2001-0008981 | 2/2001 |
| WO | WO 99/48260 | 9/1999 |

OTHER PUBLICATIONS

"JAZiO High Speed Digital I/O Signal Switching Technology", JAZiO Inc. Jul. 20, 2000.
"JAZiO details digital I/O scheme", Peter Clarke, EE Times, Jun. 15, 2000.

* cited by examiner

Primary Examiner—Minh Nguyen
(74) Attorney, Agent, or Firm—McDermott Will & Emery LLP

(57) ABSTRACT

An input circuit in a DRAM includes a differential amplifier circuit amplifying a potential difference between a potential of an input signal and a reference potential, an inverter outputting an inversion signal of an output signal of the differential amplifier circuit, a latch circuit holding an output signal in a preceding cycle, and two resistive elements for switching the reference potential in accordance with an output signal of the latch circuit. Thus, the reference potential is switched in accordance with the logic level of the input signal in the preceding cycle, allowing accurate determination of the logic level of the input signal.

11 Claims, 20 Drawing Sheets

LEVEL DETERMINATION CIRCUIT DETERMINING LOGIC LEVEL OF INPUT SIGNAL

BACKGROUND OF THE INVENTION

1. Field of the Invention

The present invention relates to a level determination circuit, and more particularly, to a level determination circuit that determines a logic level of an input signal.

2. Description of the Background Art

Conventionally, a semiconductor integrated circuit device such as a semiconductor memory or a semiconductor logic circuit is provided with an input circuit for inputting a signal. When a fast and low-amplitude signal is used, a differential amplifier circuit is used at the first stage of the input circuit. The differential amplifier circuit compares the potential of a signal with a reference potential and transmits a signal of a logic level corresponding to the comparison result to the inside.

Moreover, there is an input circuit that changes an output level of the differential amplifier circuit in response to the logic level of an output signal in order to increase the response speed of the input circuit (see Japanese Patent Laying-Open No. 9-270700 for example).

Furthermore, there is an input circuit configured to select one of two differential amplifier circuits in accordance with whether or not the logic level of an output signal is changed (see U.S. Pat. No. 6,160,423 for example).

In a system having a bus structure with many branches, such as a memory system having a plurality of memories connected to the same data bus (see FIG. 1), however, a signal waveform is distorted by reflection occurring at a branch portion, producing a stepwise waveform in a signal input into a memory (see FIG. 9). Thus, a sufficient voltage margin cannot be secured between a potential of an input signal and a threshold potential of an input circuit, often causing the input circuit to incorrectly determine the logic level of the input signal.

It is difficult to avoid occurrence of such waveform distortion without deterioration in performance, since the waveform distortion is determined by a physical structure of a bus (the number and interval of branches, the width and interval of interconnection lines, wiring delay, line impedance and the like). Thus, the waveform distortion has been a cause of hindering reduction of voltage and increase of speed in the system with the bus structure.

SUMMARY OF THE INVENTION

A primary object of the present invention is, therefore, to provide a level determination circuit that can accurately determine a logic level of an input signal.

According to an aspect of the present invention, a level determination circuit includes a comparison circuit comparing a potential of an input signal with a threshold potential for each period and outputting a signal of a logic level corresponding to a result of the comparison, and a setting circuit setting the threshold potential in a suceeding period to any one of a plurality of potentials different from one another in accordance with an output signal of the comparison circuit. Thus, the threshold potential of the comparison circuit is switched in accordance with the logic level of an input signal in a preceding period, so that the logic level of the input signal can accurately be predetermined.

According to another aspect of the present invention, a level determination circuit includes a level shift circuit shifting a potential of an input signal by a prescribed voltage for each period to generate an internal input signal, a comparison circuit comparing a potential of the internal input signal with a threshold potential for each period to output a signal of a logic level corresponding to a result of the comparison, and a setting circuit setting the prescribed voltage in a succeeding period to any one of a plurality of voltages different from one another. Thus, the potential of an input signal is shifted in accordance with a logic level of an input signal in a preceding period, so that the logic level of the input signal can accurately be determined.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
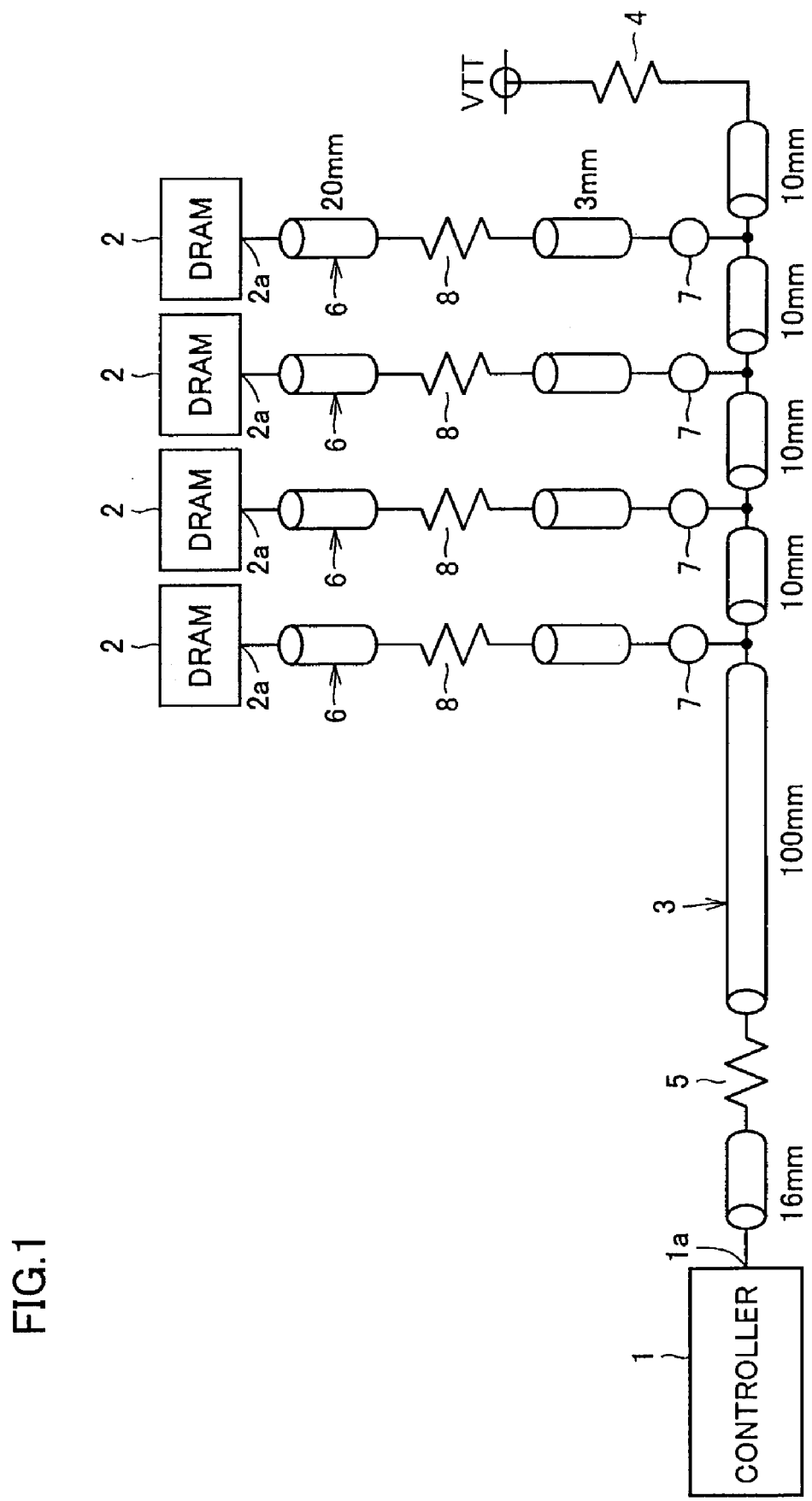
FIG. 1 is a circuit block diagram showing the entire configuration of a memory system according to the first embodiment of the present invention.

FIG. 1 is a circuit block diagram illustrating the configuration of a memory system according to the first embodiment of the present invention. In FIG. 1, the memory system includes a controller 1 and a plurality of (four in FIG. 1) DRAMs 2. A signal terminal 1a of controller 1 is connected to one end of a signal line 3, the other end of signal line 3 being connected to the line of a terminal potential VTT via a parallel terminal resistance element 4. A serial terminal resistance element 5 is interposed near controller 1 on signal line 3. Four connectors 7 are arranged at prescribed positions, respectively, on signal line 3. Each connector 7 is connected to a signal terminal 2a of each DRAM 2 via a signal line 6. A serial terminal resistance element 8 is interposed in each signal line 6.

At normal operation, signal lines 3, 6 are set at terminal potential VTT. Controller 1 sets the level of signal terminal 1a to a logic low or "L" that is lower than terminal potential VTT to apply a signal of the "L" level to each DRAM 2, and sets the level of signal terminal 1a to a logic high or "H" that is higher than terminal potential VTT to apply a signal of the "H" level to each DRAM 2. DRAM 2 senses a change in the potential of signal terminal 2a to detect the signal from controller 1.

It is noted that, in practice, a plurality of signal terminals 1a and a plurality of signal terminals 2a are provided at controller 1 and DRAM 2, respectively. Signal lines 3, 6 connecting controller 1 to DRAM 2 are also provided in a plural number. A plurality of signal lines 3, 6 form a bi-directional bus. At reading operation, a signal is applied from signal terminal 2a of DRAM 2 to signal terminal 1a of controller 1. Further, terminal resistance elements 5, 8 suppress reflection of signals. If the frequency of a signal increases, however, reflection of the signal cannot be sufficiently suppressed, increasing distortion in a waveform.

Figure 2:
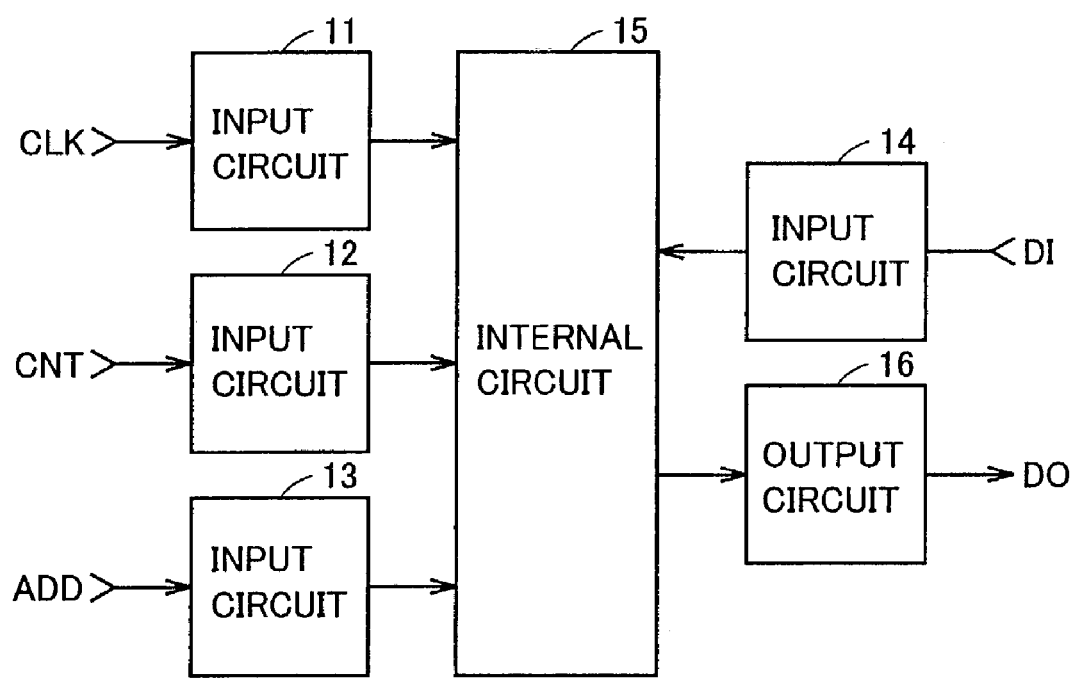
FIG. 2 is a block diagram showing the configuration of a DRAM (Dynamic Random Access Memory) shown in FIG. 1.

FIG. 2 is a block diagram illustrating a schematic configuration of DRAM 2 shown in FIG. 1. In FIG. 2, DRAM 2 includes input circuits 11 to 14, an internal circuit 15 and an output circuit 16. Input circuits 11 to 14 provide a clock signal CLK, a control signal CNT, an address signal ADD and a data signal DI, respectively, from controller 1 to internal circuit 15.

Internal circuit 15 operates in synchronization with clock signal CLK and is controlled by control signal CNT. At writing operation, internal circuit 15 writes data signal DI, applied via input circuit 14, into a memory cell designated by address signal ADD. At reading operation, internal circuit 15 reads data signal DO of a memory cell designated by address signal ADD and applies the signal to output circuit 16. Output circuit 16 applies data signal DO from internal circuit 15 to controller 1.

Figure 3:
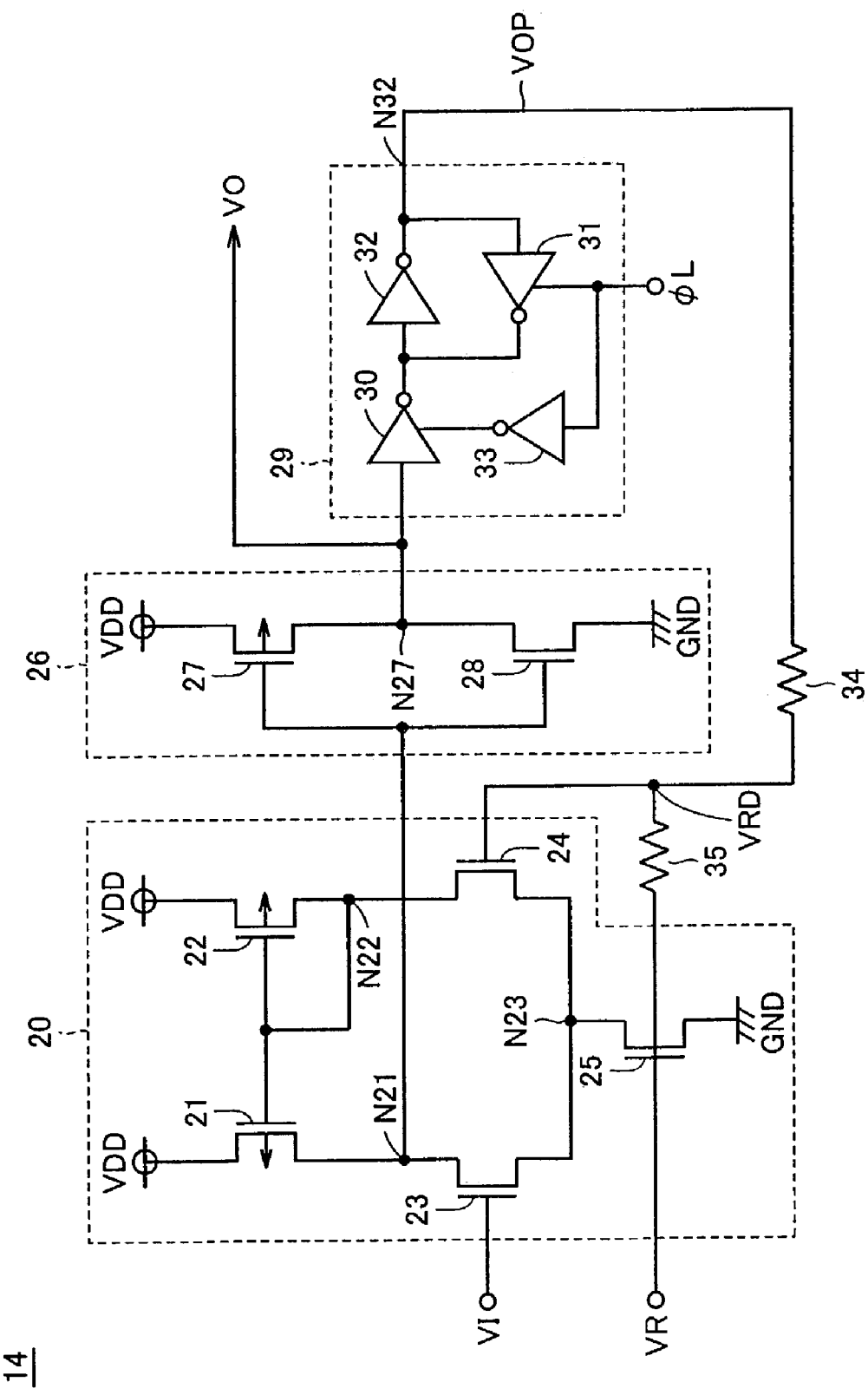
FIG. 3 is a circuit diagram showing the configuration of an input circuit shown in FIG. 2.

FIG. 3 is a circuit diagram illustrating the configuration of input circuit 14 shown in FIG. 2. In FIG. 3, input circuit 14 includes a differential amplifier circuit 20, an inverter 26, a latch circuit 29 and resistance elements 34, 35.

Differential amplifier circuit 20 includes P-channel MOS transistors 21, 22 and N-channel MOS transistors 23 to 25. P-channel MOS transistors 21, 22 are connected between the lines of a power-supply potential VDD and nodes N21, N22, respectively, and have their respective gates connected to node N22. P-channel MOS transistors 21 and 22 form a current mirror circuit. N-channel MOS transistors 23, 24 are connected between node N23 and nodes N21, N22, respectively, and have their gates receiving an input signal VI (data signal DI) and a reference potential VRD, respectively. Reference potential VRD is switched between a first potential VRDL (e.g. 0.8V) and a second potential VRDH (e.g. 1.0V), which will be described later. N-channel MOS transistor 25 is connected between node N23 and the line of a ground potential GND, and has its gate receiving reference potential VR (e.g. 0.9V). N-channel MOS transistor 25 forms a constant current source.

Current of a value corresponding to reference potential VRD flows in N-channel MOS transistor 24. N-channel MOS transistor 24 and P-channel MOS transistor 22 are connected in series while P-channel MOS transistors 21, 22 form a current mirror circuit, so that current of a value corresponding to the current flowing in N-channel MOS transistor 24 flows in P-channel MOS transistor 21. If the potential of input signal VI is higher than reference potential VRD, current flowing in N-channel MOS transistor 23 has a value higher than the current flowing in P-channel MOS transistor 21, lowering the level of node N21. If the potential of input signal VI is lower than reference potential VRD, the current flowing in N-channel MOS transistor 23 is smaller than the current flowing in P-channel MOS transistor 21, raising the level of node N21.

Inverter 26 includes P-channel MOS transistor 27 and an N-channel MOS transistor 28. P-channel MOS transistor 27 is connected between the line of power-supply potential VDD and the line of an output node N27, and has its gate connected to node N21. N-channel MOS transistor 28 is connected between the line of ground potential GND and output node N27, and has its gate connected to node N21.

If the level of node N21 is lowered to a value lower than a threshold potential of inverter 26, N-channel MOS transistor 28 is rendered non-conductive while P-channel MOS transistor 27 is rendered conductive, output node N27 having the "H" level. If the level of node N21 increases to a value higher than the threshold potential of inverter 26, P-channel MOS transistor 27 is rendered non-conductive while N-channel MOS transistor 28 is rendered conductive, output node N27 having the "L" level. A signal appearing at output node N27 is an output signal VO of input circuit 14. Signal VO is input into internal circuit 15 and is applied to latch circuit 29.

Latch circuit 29 includes clocked inverters 30, 31 and inverters 32, 33. Clocked inverter 30 and inverter 32 are connected in series between nodes N27 and N32. Clocked inverter 31 is connected between an output node and an input node of inverter 32. A latch signal φL is input into a control node of clocked inverter 30 via inverter 33, and is directly input to a control node of clocked inverter 31.

If signal φL is at the "L" level, clocked inverter 31 is inactivated while clocked inverter 30 is activated, a signal at node N27 being transmitted to node N32 via inverters 30, 32 (a through state). Accordingly, nodes N27 and N32 have the same logic level.

If signal φL is raised from the "L" level to the "H" level, clocked inverter 30 is inactivated while clocked inverter 31 is activated, latching the level of node N32 (a hold state). Input signal VI and signal φL change in synchronization with clock signal CLK. A signal VOP appearing at node N32 is a signal corresponding to output signal VO delayed by one clock cycle.

Resistance element 34 is connected between node N32 and the gate of N-channel MOS transistor 24. Resistance element 35 is connected between the gate of N-channel MOS transistor 24 and the node of reference potential VR.

A ratio R34: R35 of a resistance value R34 of resistance element 34 to a resistance value R35 of resistance element 35 is set as 8:1 in the description below, though not particularly limited thereto.

If node N32 is at the "H" level (power-supply potential VDD=1.8V), a node potential between resistance elements 34 and 35, i.e. reference potential VRD, is VRDH=0.9+(1.8−0.9)/9=1.0V. If node N32 is at the "L" level (ground potential GND=0V), reference potential VRD is VRDL=0.9×8/9=0.8V.

Figure 4:
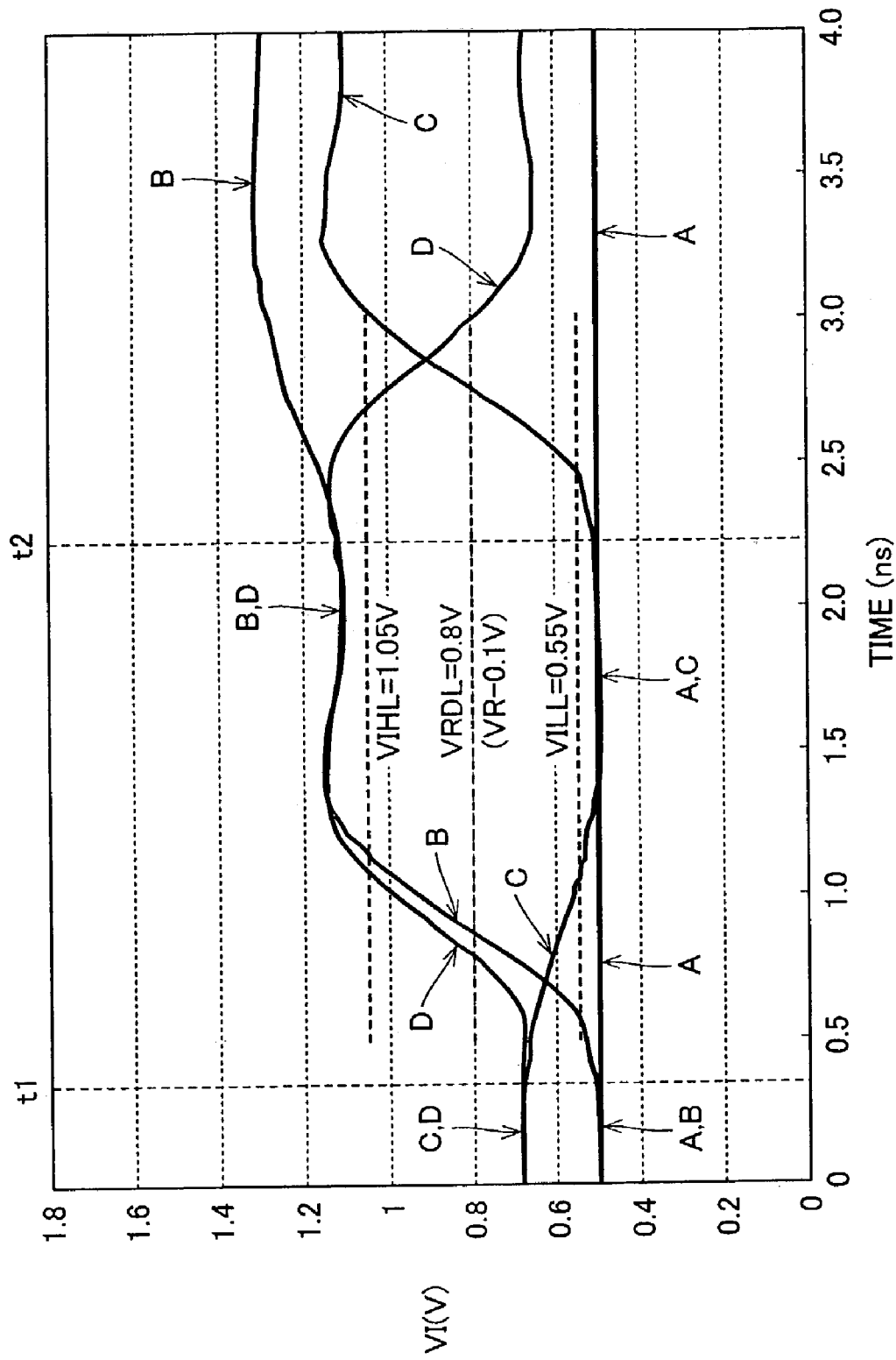
FIG. 4 is a time chart illustrating the operation of the input circuit shown in FIG. 3.

FIG. 4 is a time chart illustrating changes in the potential of input signal VI. In the memory system as described with reference to FIG. 1, the potential of input signal VI changes in accordance with the level of input signal VI. In FIG. 4, four potential change curves A to D are illustrated by way of example.

In FIG. 4, at time t1, curves A, B are near 0.5V, whereas curves C, D are near 0.7V. Here, curves A to D are all at the "L" level. A potential difference is generated, however, between curves A, B and curves C, D, since curves A, B were at "L" level while curves C, D were at the "H" level in the preceding cycle.

After time t1, input signal VI is set to the "L" level again on curves A, C, while input signal VI is changed to the "H" level on curves B, D. Input signal VI is at approximately 0.5V on curves A, C, and is at approximately 1.1V on curves B, D. Because input signal VI in the preceding cycle (before time t1) was at the "L" level, reference potential VRD here corresponds to first potential VRDL=VR−0.1V=0.8V. If the potential of input signal VI exceeds a threshold potential VIHL=0.8+0.25=1.05V during rising, the level of input signal VI is determined as the "H" level. If the potential of input signal VI is lowered past a threshold potential VILL=0.8−0.25=0.55V during falling, the level of input signal VI is determined as the "L" level. Accordingly, the logic level of input signal VI is accurately determined.

Figure 5:
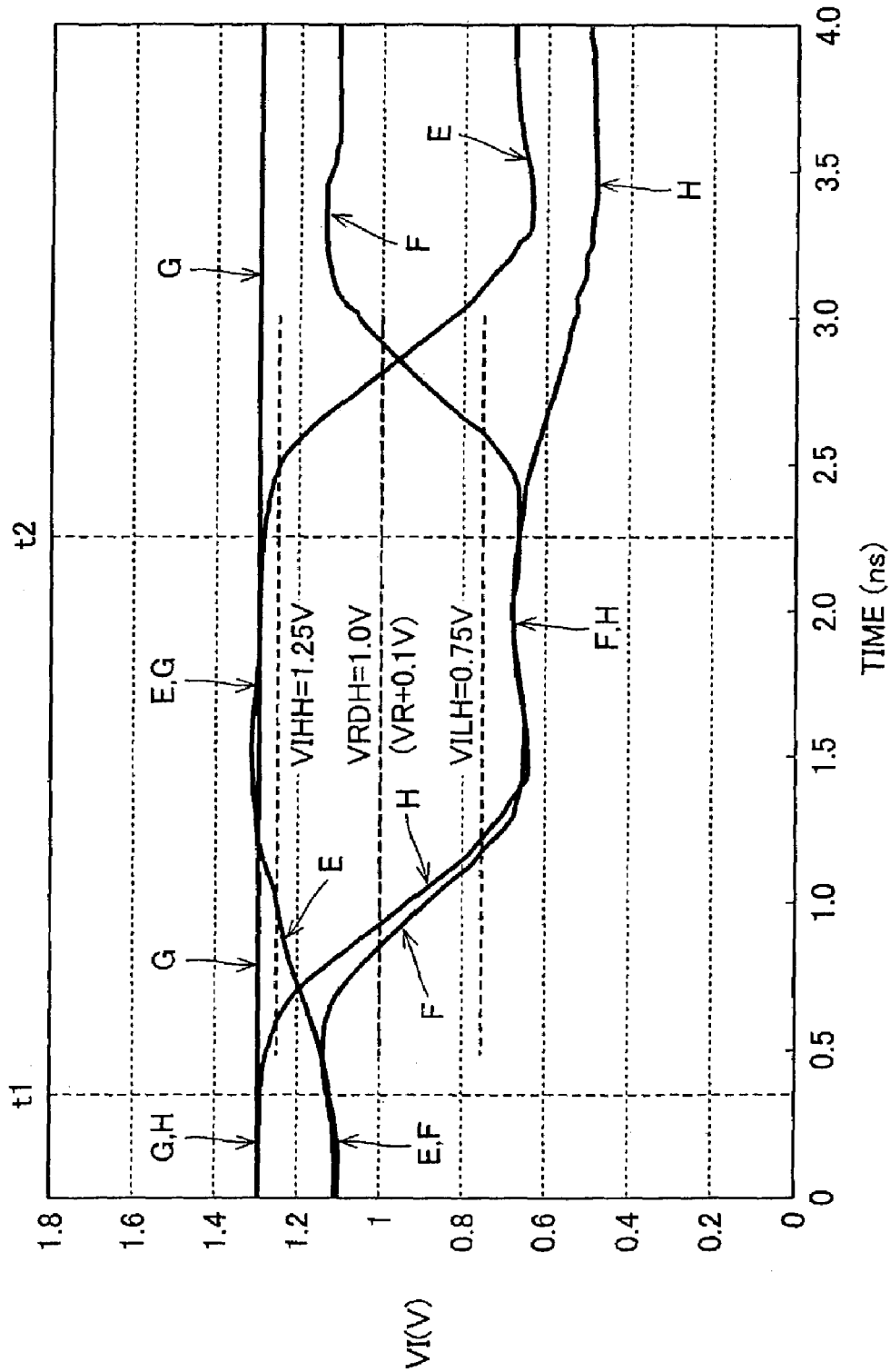
FIG. 5 is another time chart illustrating the operation of the input circuit shown in FIG. 3.

FIG. 5 is another time chart illustrating changes in the potential of input signal VI. In FIG. 5, four potential change curves E to H are illustrated by way of example. In FIG. 5, before time t1, curves E, F are near 1.1V, whereas curves G, H are near 1.3V. Here, curves E to H are all at the "H" level. A potential difference is generated, however, between curves E, F and curves G, F, since curves E, F were at the "L" level while curves G, H were at the "H" level in the preceding cycle.

After time t1, input signal VI is set to the "H" level again on curves E, G, while input signal VI is changed to the "L" level on curves F, H. Input signal VI is approximately 1.3V on curves E, G, whereas input signal VI is at approximately 0.7V on curves F, H. Here, because input signal VI in the preceding cycle (before time t1) was at the "H" level, reference potential VRD corresponds to second potential VRDH=VR+0.1V=1.0V. If the potential of input signal VI exceeds a threshold potential VIHH=1.0+0.25=1.25V during rising, the level of input signal VI is determined as the "H" level. If the potential of input signal VI is lowered past a threshold potential VILH=1.0−0.25=0.75V during falling, the level of input signal VI is determined as the "L" level. Accordingly, the logic level of input signal VI is also accurately determined.

Figure 6:
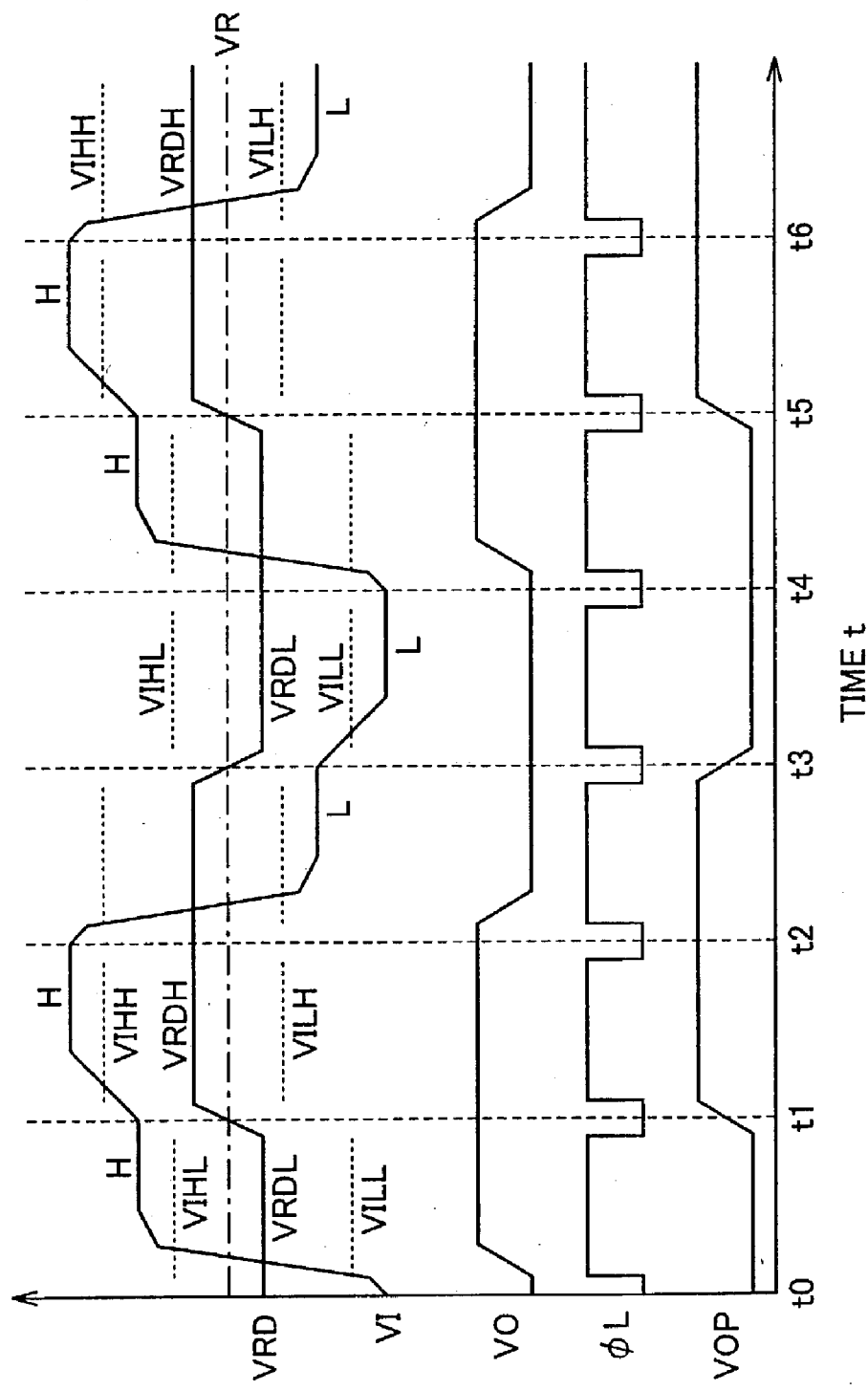
FIG. 6 is a further time chart illustrating the operation of the input circuit shown in FIG. 3.
Figure 7:
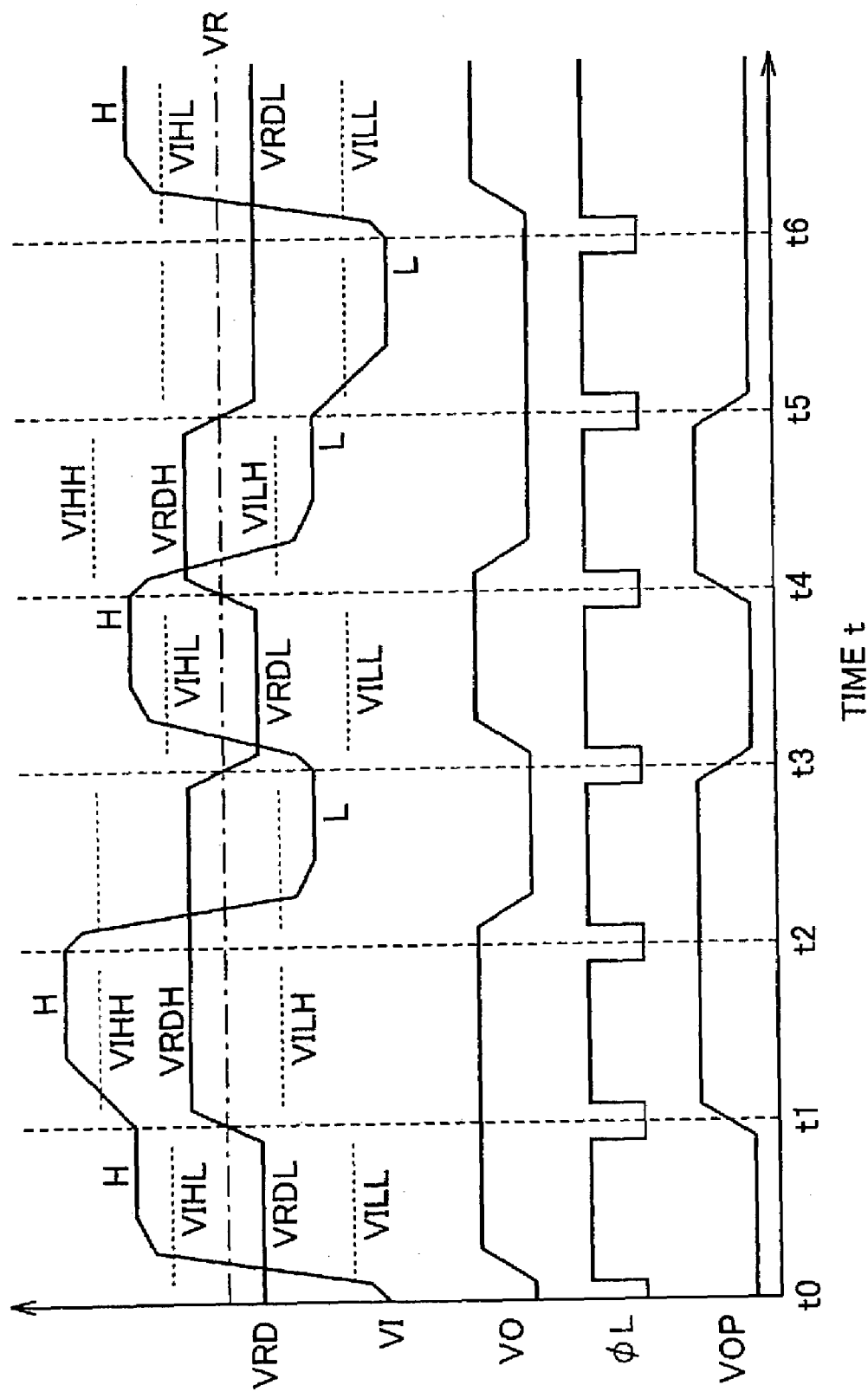
FIG. 7 is yet another time chart illustrating the operation of the input circuit shown in FIG. 3.
Figure 8:
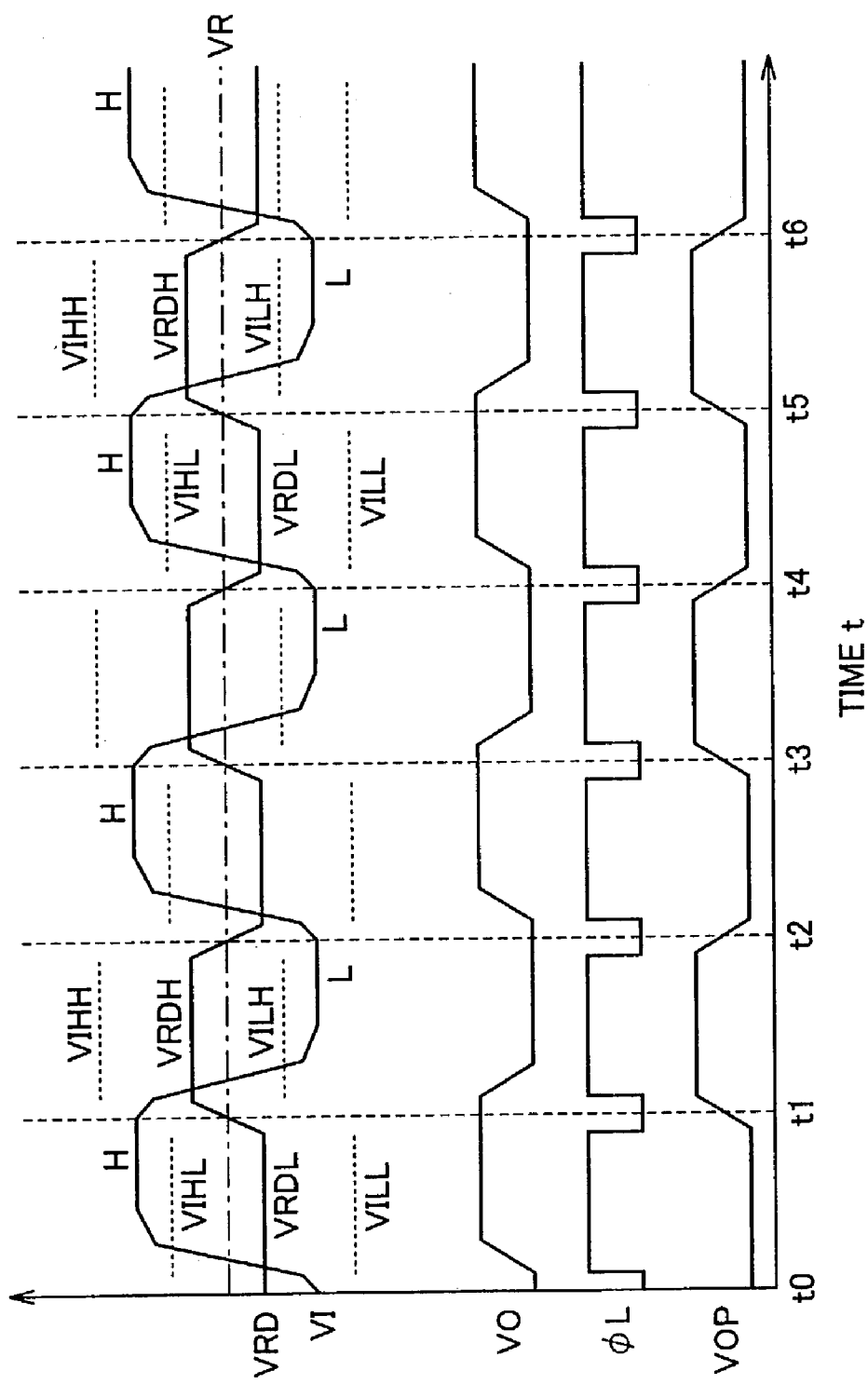
FIG. 8 is a still further time chart illustrating the operation of the input circuit shown in FIG. 3.

Further, FIGS. 6 to 8 are time charts illustrating the relation between reference potential VRD and signals VI, VO, φL and VOP. In FIGS. 6 to 8, one scale on the horizontal axis (for example, from t0 to t1) corresponds to one clock cycle. Reference potential VRD and each of signals VI, VO, φL and φVOP are switched on a clock cycle basis.

Signal φL is set to the "L" level for a prescribed time period during each transition period of clock cycles. Latch circuit 29 is in the through state during the "L" level period of signal φL, so that signal VO passes through latch circuit 29 to be signal VOP. If signal φL is raised from the "L" level to the "H" level, the level of signal VOP is held. Thus, signal VOP corresponds to signal VO delayed by one clock cycle.

Reference potential VRD changes in response to signal VOP. If signal VOP is set to the "H" level, reference potential VRD comes to be a relatively high first potential VRDH. If signal VOP is set to the "L" level, reference potential VRD comes to be a relatively low second potential VRDL.

The potential of input signal VI is affected by the logic level of input signal VI in the preceding cycle. If input signal VI was at the "H" level in the preceding cycle, it has a relatively high potential in the present cycle. If input signal VI was at the "L" level in the preceding cycle, it has a relatively low potential in the present cycle. As such, the potential of input signal VI and reference potential VRD both change in accordance with the logic level of input signal VI in the preceding cycle, allowing accurate determination of the logic level of input signal VI.

In FIG. 6, it can be seen that the logic level of input signal VI is accurately determined even if the logic level of input signal VI remains unchanged for two clock cycles. In FIG. 7, it can be seen that the logic level of input signal VI is accurately determined even if the logic level of input signal VI changes randomly. In FIG. 8, it can be seen that the logic level of input signal VI is accurately determined even if the logic level of input signal VI changes every clock cycle.

According to the first embodiment, reference potential VRD is switched in accordance with the logic level of input signal VI in the preceding cycle, so that the logic level of input signal VI can accurately be determined irrespective of a high operating frequency.

It is noted that the logic level of input signal VI cannot be accurately determined if latch circuit 29 and resistive elements, 34, 35 are removed from input circuit 14 such that reference potential VR (=0.9V) is directly input into N-channel MOS transistor 24 (a comparison example).

Figure 9:
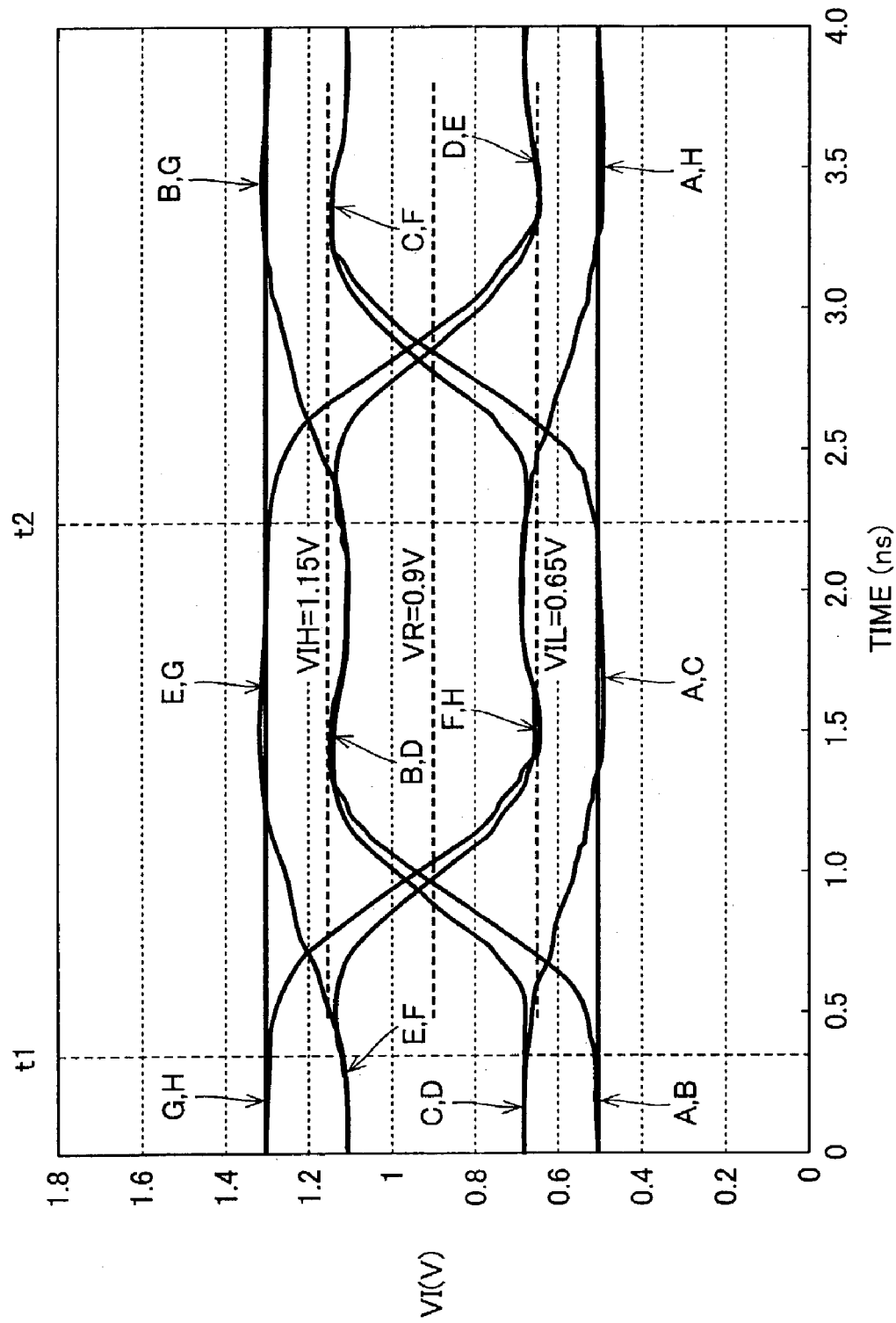
FIG. 9 is a time chart illustrating an effect of the input circuit shown in FIG. 3.

FIG. 9 is a time chart illustrating the relationship between potential change curves A to H and reference potential VR in such a case. Curves A to H are the same as those shown in FIGS. 4 and 5. In this case, reference potential VR is fixed at 0.9V, so that VIH is 1.15V whereas VIL is 0.65V in differential amplifier circuit 20. If the logic level of input signal VI is changed from the value in the preceding cycle, input signal VI is at approximately 1.1V on curves B, D while it is at approximately 0.7V on curves F, H at, for example, time t2. Thus, if the logic level of input signal VI is changed from the value in the preceding cycle, input signal VI does not pass threshold potential VIH/VIL, hindering accurate determination of the logic level of input signal VI.

Figure 10:
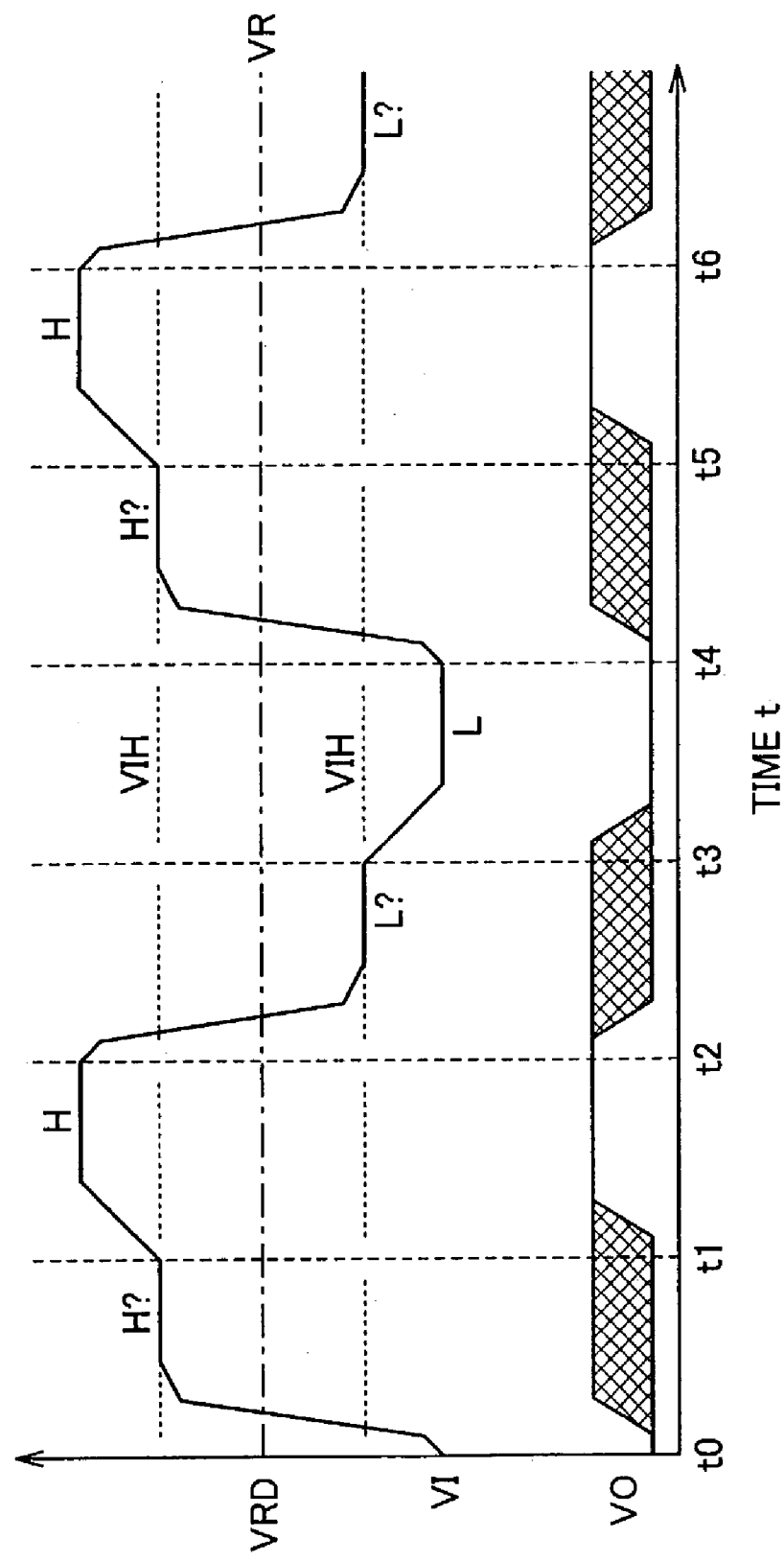
FIG. 10 is another time chart illustrating an effect of the input circuit shown in FIG. 3.

FIG. 10 is a time chart illustrating the relation among reference potential VRD, input signal VI and output signal VO in such a comparison example. Reference potential VRD is equal to external reference potential VR and is constant. The potential of input signal VI changes in accordance with the logic level of input signal VI in the preceding cycle. If the logic level of input signal VI is the same as that in the preceding cycle, the logic level of input signal VI can be determined. If the logic level of input signal VI is different from that in the preceding cycle, however, the logic level of input signal VI cannot be determined. Accordingly, the level of output signal VO is unstable.

[Second Embodiment]

Figure 11:
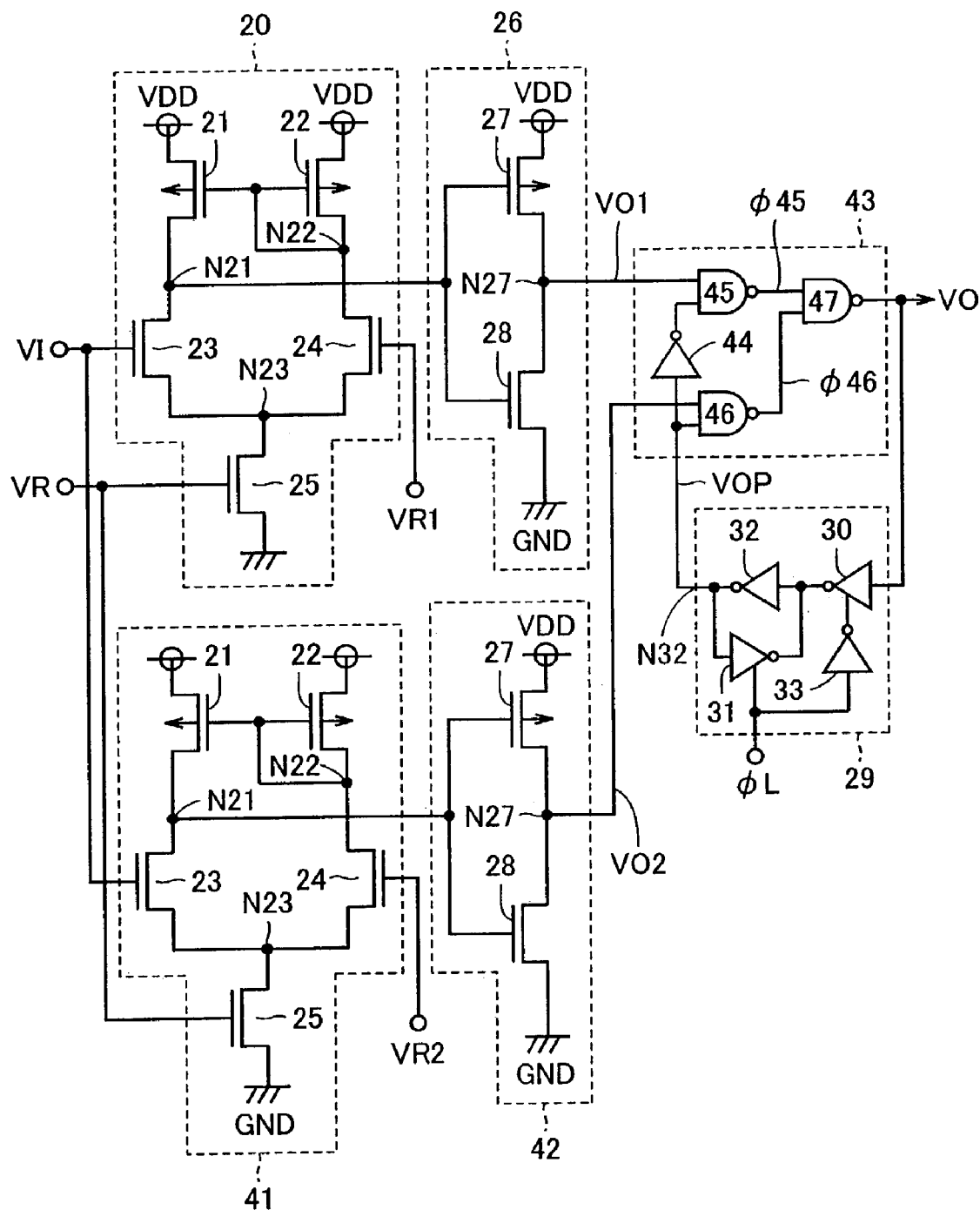
FIG. 11 is a circuit diagram illustrating the configuration of an input circuit according to the second embodiment of the present invention.

FIG. 11 is a circuit diagram illustrating the configuration of an input circuit 40 according to the second embodiment of the present invention. Referring to FIG. 11, input circuit 40 is different from input circuit 14 in that resistive elements 34, 35 are removed and that a differential amplifier circuit 41, an inverter 42 and a switching circuit 43 are added.

Differential amplifier circuit 41 has the same configuration as that of differential amplifier circuit 20. Differential amplifier circuits 20, 41 include respective N-channel MOS transistors 25, with their gates both receiving reference potential VR. Differential amplifier circuits 20, 41 also include respective N-channel MOS transistors 24 having the gates receiving reference potentials VR1, VR2, respectively. Reference potentials VR, VR1 and VR2 correspond to 0.9V, 0.8V and 1.0V, respectively, in the description below, though not particularly limited thereto. Differential amplifier circuit 20 is used to determine the logic level of input signal VI when input signal VI in the preceding cycle is at the "L" level as described with reference to FIG. 4. Differential amplifier circuit 41 is used to determine the logic level of input signal VI when input signal VI in the preceding cycle is at the "H" level as described with reference to FIG. 5. Output signals of differential amplifier circuits 20, 41 are input into inverters 26, 42, respectively.

Switching circuit 43 includes an inverter 44 and NAND gates 45 to 47. Each of output signals VO1, VO2 of inverters 26, 42 is input into one input node of each of NAND gates 45, 46, respectively. Output signals φ45, φ46 of NAND gates 45, 46 are input into NAND gate 47. The output signal of NAND gate 47 is an output signal of VO of input circuit 40. Signal VO is input into inverter 30 of latch circuit 29. Output signal VOP of latch circuit 29 is input into the other input node of NAND gate 45 via inverter 44, and is directly input into the other input node of NAND gate 46.

If input signal VI in the preceding cycle was at the "L" level, i.e., if signal VOP is at the "L" level, output signal φ46 of NAND gate 46 is fixed at the "H" level, and output signal VO1 of inverter 26 passes through NAND gates 45, 47 to be signal VO.

If input signal VI in the preceding cycle was at the "H" level, i.e. if signal VOP is at the "H" level, output signal φ45 of NAND gate 45 is fixed at the "H" level, and output signal VO2 of inverter 42 passes through NAND gates 46, 47 to be signal VO.

Figure 12:
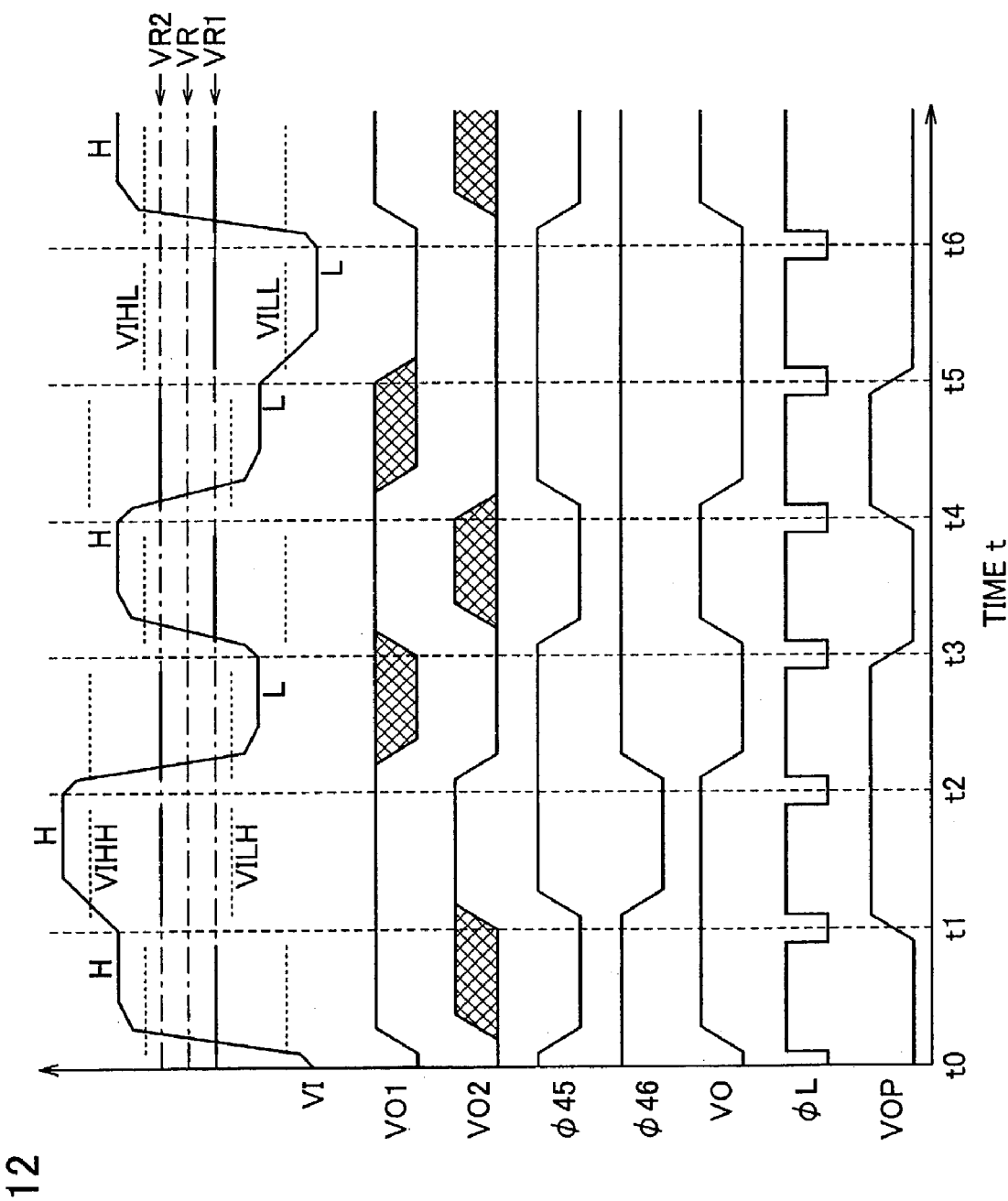
FIG. 12 is a time chart illustrating the operation of the input circuit shown in FIG. 11.

FIG. 12 is a time chart illustrating the operation of input circuit 40 by contrast with FIG. 7. In FIG. 12, if input signal VI was at the "L" level in the preceding cycle, the potential of input signal VI becomes relatively low (for example, from time t0 to t1). Accordingly, output signal VO1 of inverter 26 is determined, whereas output signal VO2 of inverter 42 is unstable. Here, signal VOP is at the "L" level, so that signal VO1 of signals VO1, VO2 is selected at switching circuit 43 to be signal VO. It is noted that output signal φ46 of NAND gate 46 is fixed at the "H" level even if the level of signal VO2 is unstable, causing no adverse effects on signal VO.

Further, if input signal VI was at the "H" level in the preceding cycle, the potential of input signal VI becomes relatively high (for example, from time t2 to t3). Accordingly, the level of output signal VO2 of inverter 42 is determined, whereas the output signal VO1 of inverter 26 is unstable. Here, signal VOP is at the "H" level, so that signal VO2 of signals VO1, VO2 is selected at switching circuit 43 to be signal VO. It is noted that output signal φ45 of NAND gate 45 is fixed at the "H" level even if the level of signal VO1 is unstable, causing no adverse effects on signal VO.

In the second embodiment, differential amplifier circuit 20 using relatively low reference potential VR1 and differential amplifier circuit 41 using relatively high reference potential VR2 are provided to generate output signal VO of input circuit 40 based on one of the output signals of differential amplifier circuits 20, 41 in accordance with the logic level of input signal VI in the preceding cycle. Accordingly, the logic level of input signal VI can accurately be determined irrespective of a high operating frequency.

While two differential amplifier circuits 20, 41 receiving different reference potentials VR1, VR2 were provided in the second embodiment, it is not limited thereto. It is understood that the same effect can be obtained with any two differential amplifier circuits that have different threshold potentials. For instance, two differential amplifier circuits receiving different substrate potentials or two differential amplifier circuits having different transistor sizes may also be provided in place of differential amplifier circuits 20, 41.

[Third Embodiment]

Figure 13:
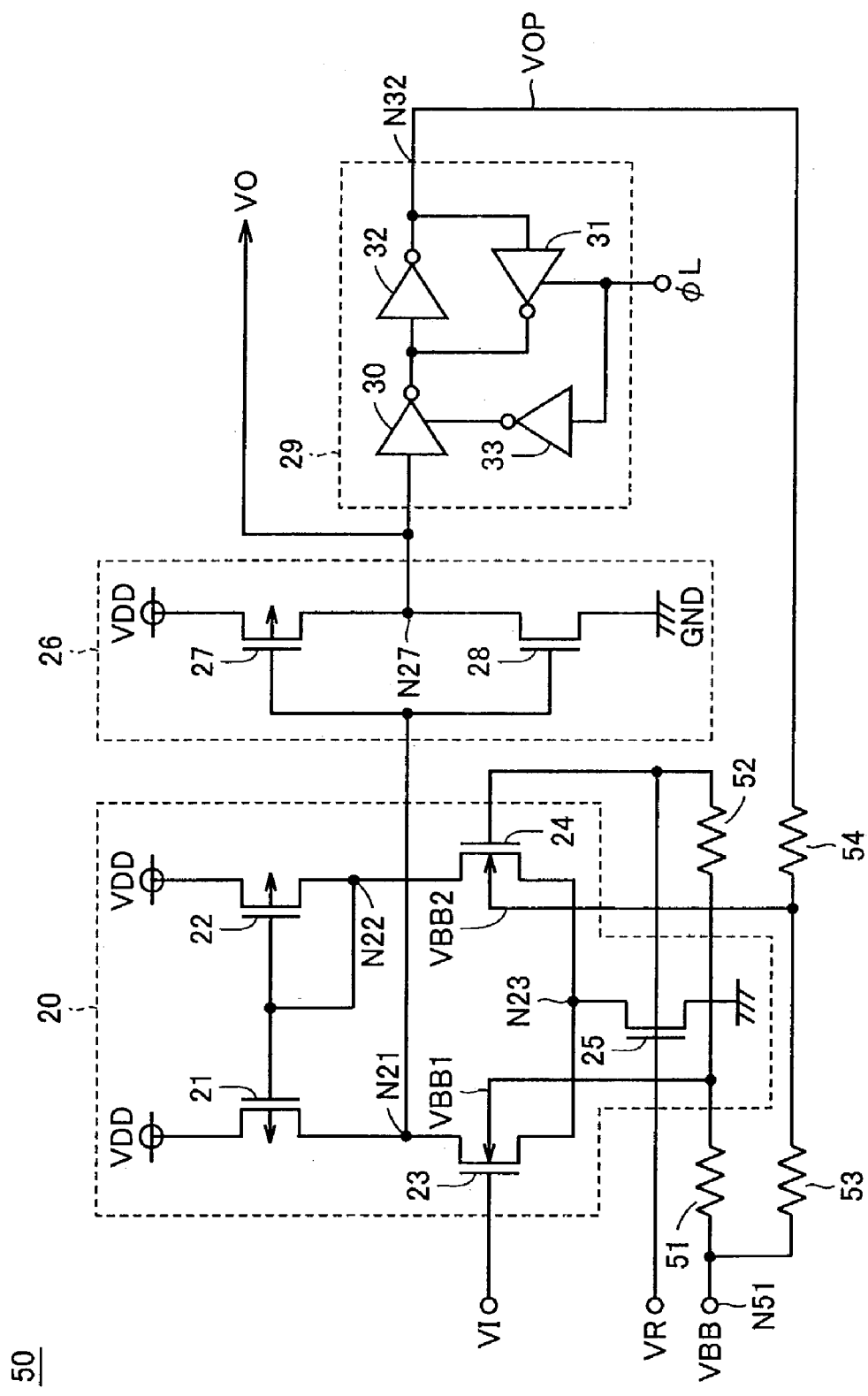
FIG. 13 is a circuit diagram illustrating the configuration of an input circuit according to the third embodiment of the present invention.

FIG. 13 is a circuit diagram illustrating the configuration of an input circuit 50 according to the third embodiment of the present invention. In FIG. 13, input circuit 50 is different from input circuit 14 in FIG. 3 in that resistive elements 34, 35 are replaced by resistive elements 51 to 54. Reference potential VR (=0.9V) is applied to the gate of N-channel MOS transistor 24, whereas a substrate potential VBB (assumed as −0.6V in the description below, though not particularly limited thereto) is applied to node N51.

Resistive elements 51, 52 are connected in series between node N51 and the gate of N-channel MOS transistor 24. A ratio R51:R52 of a resistance value R51 of resistive element 51 to a resistance value R52 of resistive element 52 is set as 1:5 in the description below, though not particularly limited thereto. Accordingly, a potential VBB1 at the node between resistive elements 51 and 52 is −0.35V. Potential VBB1 is applied to the substrate of N-channel MOS transistor 23.

Resistive elements 53, 54 are connected in series between node N51 and output node N32 of latch circuit 29. A ratio R53:R54 of a resistance value R53 of resistive element 53 to a resistance value R54 of resistive element 54 is equal to the ratio of R51 to R52, and is set as 1:5 in this example. A potential VBB2 at the node between resistive elements 53 and 54 is represented by VBB2=VBB2L=−0.5V if output node N32 of latch circuit 29 is at the "L" level (ground potential GND=0V), whereas it is represented by VBB2=VBB2H=−0.2V if output node N32 of latch circuit 29 is at the "H" level (power-supply potential VDD=1.8V). Potential VBB2 is applied to the substrate of N-channel MOS transistor 24.

The threshold potential of an N-channel MOS transistor rises as the substrate potential decreases. The threshold potential of N-channel MOS transistor 24 with substrate potential VBB2 of VBB2L=−0.5V is higher than the threshold potential of N-channel MOS transistor 23 with substrate potential VBB1 of −0.35V. The threshold potential of N-channel MOS transistor 24 with substrate potential VBB2 of VBB2H=−0.2V is lower than the threshold potential of N-channel MOS transistor 23 with substrate potential VBB1 of −0.35V.

Thus, setting substrate potential VBB2 of N-channel MOS transistor 24 to VBB2L=−0.5V is the same as somewhat lowering potential reference VR. Likewise, setting substrate potential VBB2 of N-channel MOS transistor 24 to VBB2H=−0.2V is the same as somewhat raising reference potential VR. In other words, setting substrate potential VBB2 of N-channel MOS transistor 24 to VBB2L=−0.5V is the same as lowering the current value of a current source constituted by MOS transistors 21, 22 and 24. Likewise, setting substrate potential VBB2 of N-channel MOS transistor 24 to VBB2H=−0.2V is the same as raising the current value of the current source constituted by MOS transistors 21, 22 and 24.

Figure 14:
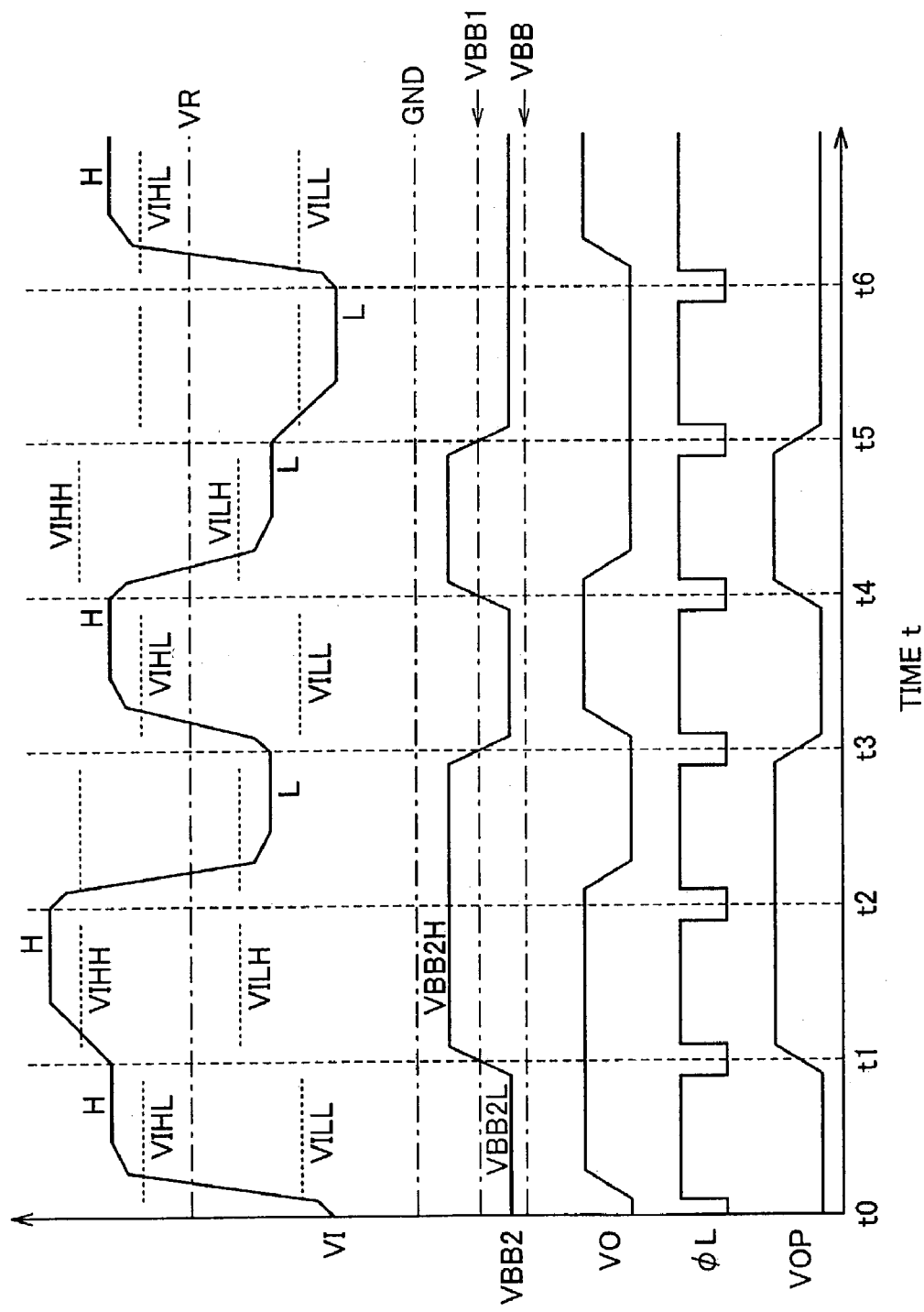
FIG. 14 is a time chart illustrating the operation of the input circuit shown in FIG. 13.

FIG. 14 is a time chart illustrating the operation of an input circuit 50. Substrate potential VBB2 of N-channel MOS transistor 24 is VBB2L=−0.5V if input signal VI in the preceding cycle is at the "L" level, i.e., if signal VOP is at the "L" level, whereas it is VBB2H=−0.2V if input signal VI in the preceding cycle is at the "H" level, i.e., if signal VOP is at the "H" level.

If input signal VI is at the "L" level in the preceding cycle, the potential of input signal VI becomes relatively low (for example, from time t0 to t1). Here, substrate potential VBB2 of N-channel MOS transistor 24 is lowered to raise the threshold potential thereof, while the current value of the current source constituted by MOS transistors 21, 22 and 24 is reduced to lower threshold potential VIH/VIL of differential amplifier circuit 20. Accordingly, the logic level of input signal VI can accurately be determined.

Moreover, if input signal VI is at the "H" level in the preceding cycle, the potential of input signal VI becomes relatively high (for example, from time t1 to t2). Here, substrate potential VBB2 of N-channel MOS transistor 24 is increased to lower the threshold potential thereof, while the current value of the current source constituted by MOS transistors 21, 22 and 24 is increased to raise threshold potential VIH/VIL of differential amplifier circuit 20. Accordingly, the logic level of input signal VI can accurately be determined.

In the third embodiment, the relation between the levels of substrate potentials VBB1 and VBB2 of N-channel MOS transistors 23 and 24, respectively, are switched in accordance with the logic level of input signal VI in the preceding cycle, allowing accurate determination of the logic level of input signal VI irrespective of a high operating frequency.

[Fourth Embodiment]

Figure 15:
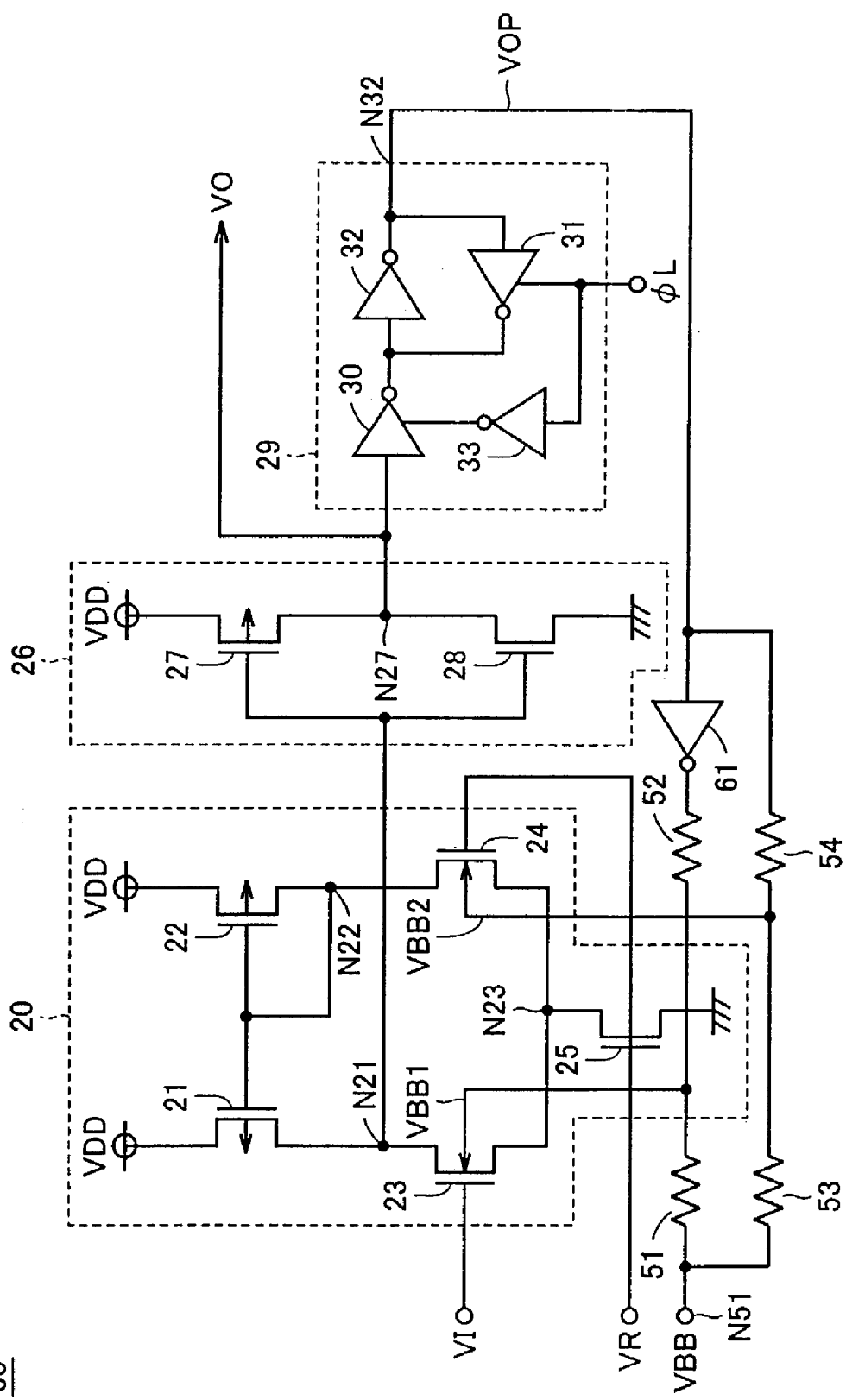
FIG. 15 is a circuit diagram illustrating the configuration of an input circuit according to the fourth embodiment of the present invention.

FIG. 15 is a circuit diagram showing the configuration of an input circuit 60 according to the fourth embodiment of the present invention. Referring to FIG. 15, input circuit 60 is different from input circuit 50 in FIG. 13 in that an inverter 61 is added. Inverter 61 and resistive elements 52, 51 are connected in series between output node N32 of latch circuit 29 and node N51. A ratio R51:R52 of resistance value R51 of resistive element 51 to resistance value R52 of resistive element 52 are set as 1:11 in the description below, though not particularly limited thereto. A ratio R53:R54 of resistance value R53 of resistive element 53 to resistance value R54 of resistive element 54 is equal to the ratio of R51 to R52, and is set as 1:11 in this example. Furthermore, substrate potential VBB is assumed as −0.6V.

If output node N32 of latch circuit 29 is at the "L" level (ground potential GND=0V), substrate potentials VBB1, VBB2 are set to VBBH=−0.4V, VBBL=−0.55V, respectively. If output node N32 of latch circuit 29 is at the "H" level (power-supply potential VDD=1.8V), substrate potentials VBB1, VBB2 are set to VBBL=−0.55V, VBBH=−0.4V, respectively.

Figure 16:
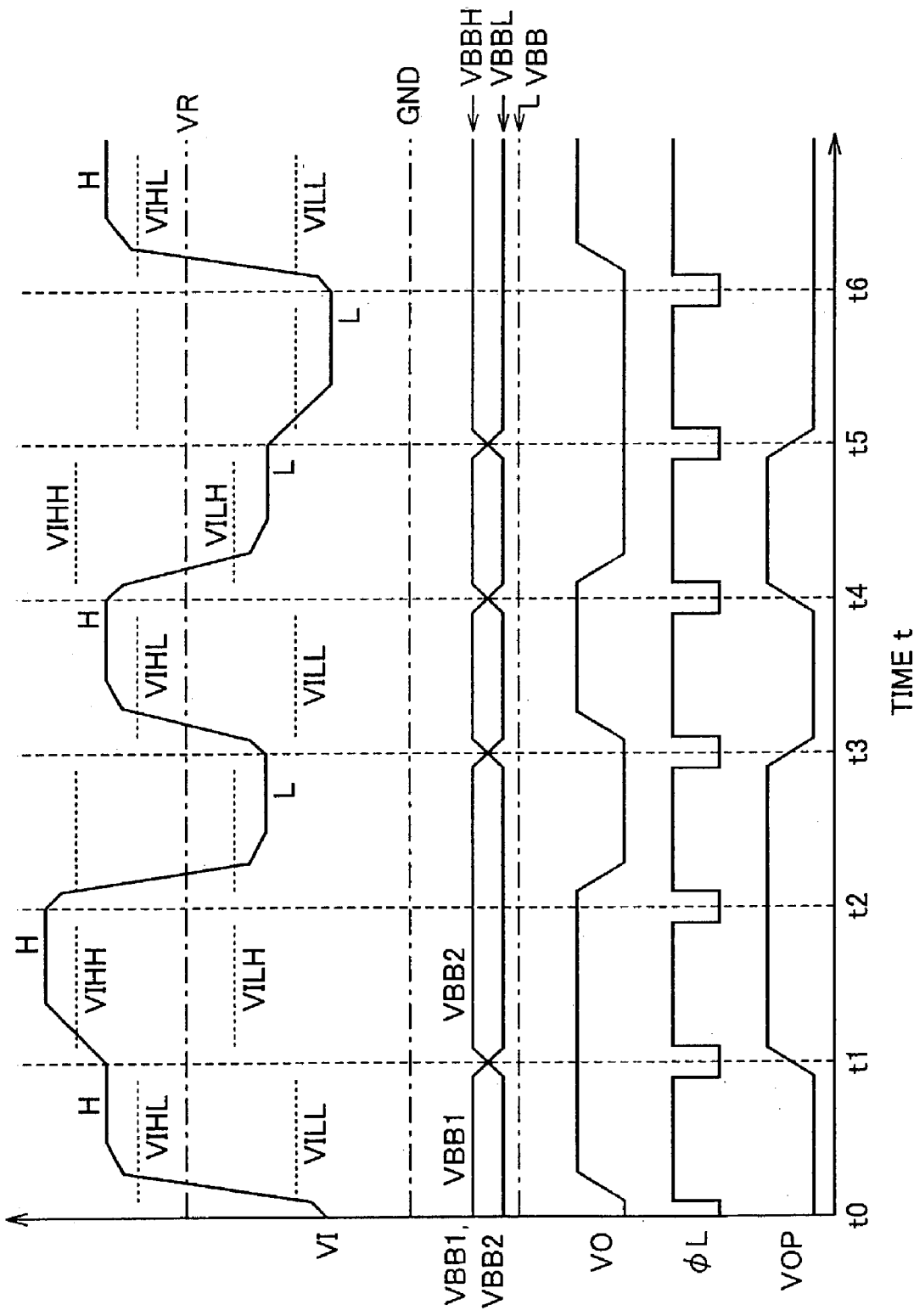
FIG. 16 is a time chart illustrating the operation of the input circuit shown in FIG. 15.

FIG. 16 is a time chart illustrating the operation of input circuit 60. If input signal VI is at the "L" level in the preceding cycle, the potential of input signal VI becomes relatively low (for example, from time t0 to t1). Here, substrate potential VBB1 of N-channel MOS transistor 23 is increased to lower the threshold potential of N-channel MOS transistor 23, while substrate potential VBB2 of N-channel MOS transistor 24 is lowered to increase the threshold potential of N-channel MOS transistor 24 and to lower threshold potential VIH/VIL of differential amplifier circuit 20. Thus, the logic level of input signal VI can accurately be determined.

Moreover, if input signal VI is at the "H" level in the preceding cycle, the potential of input signal VI becomes relatively high (for example, from time t1 to t2). Here, substrate potential VBB1 of N-channel MOS transistor 23 is lowered to raise the threshold potential of N-channel MOS transistor 23, while substrate potential VBB2 of N-channel MOS transistor 24 is increased to lower the threshold potential of N-channel MOS transistor 24 and to raise threshold potential VIH/VIL of differential amplifier circuit 20. Accordingly, the logic level of input signal VI can accurately be determined.

In the fourth embodiment, the relation between the levels of substrate potentials VBB1 and VBB2 of N-channel MOS transistors 23 and 24, respectively, are switched in accordance with the logic level of input signal VI in the preceding cycle, allowing accurate determination of the logic level of input signal VI irrespective of a high operating frequency.

[Fifth Embodiment]

Figure 17:
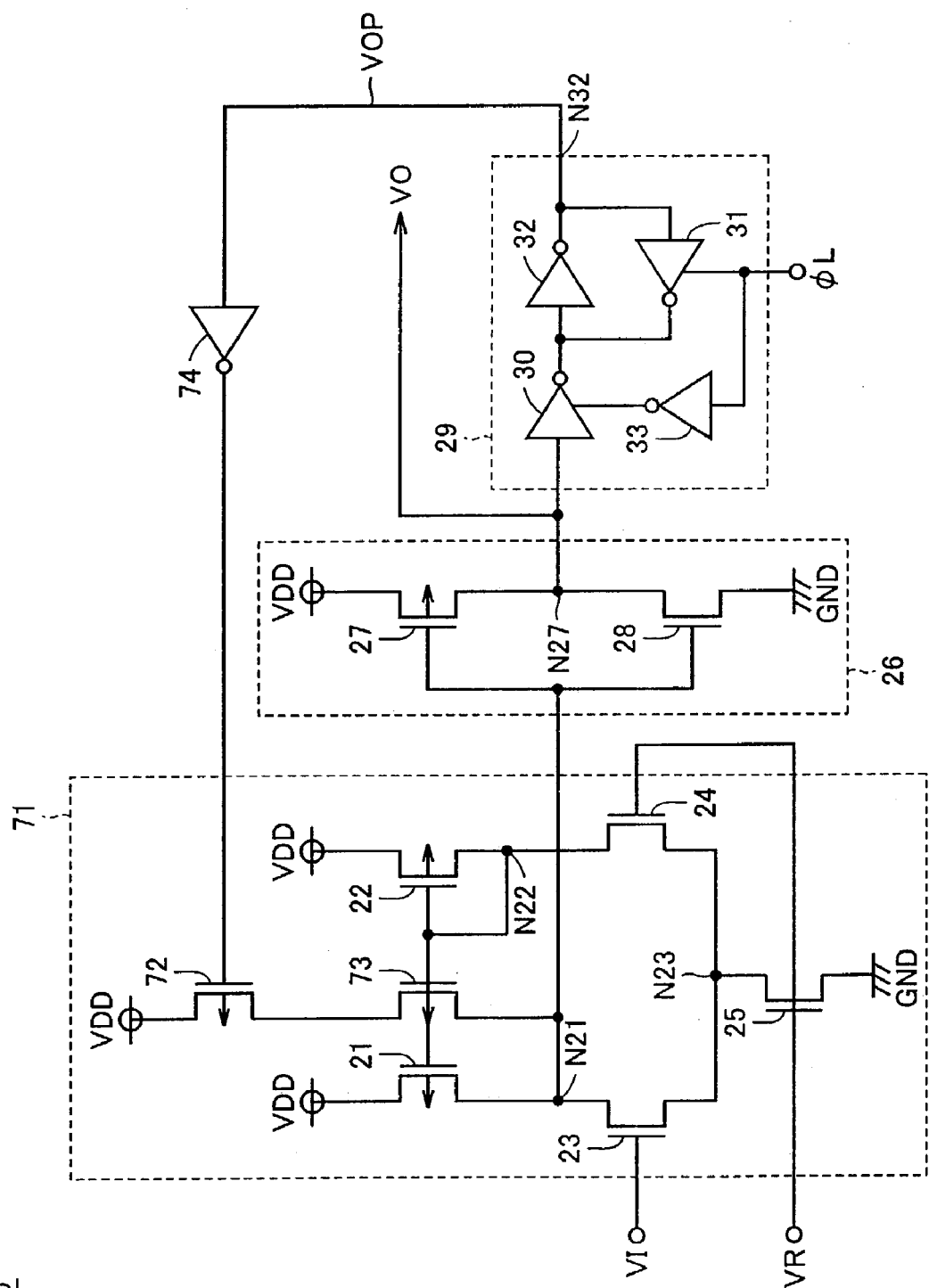
FIG. 17 is a circuit diagram illustrating the configuration of an input circuit according to the fifth embodiment of the present invention.

FIG. 17 is a circuit diagram showing the configuration of an input circuit 70 according to the fifth embodiment of the present invention. Referring to FIG. 17, input circuit 70 is different from input circuit 14 in FIG. 3 in that differential amplifier circuit 20 is replaced by differential amplifier circuit 71, resistive elements 34, 35 are removed, and an inverter 74 is added.

Differential amplifier circuit 71 is formed by adding P-channel MOS transistors 72, 73 to differential amplifier circuit 20 and by reducing the size of P-channel MOS transistor 21 to be smaller than the size of P-channel MOS transistor 22. P-channel MOS transistors 72, 73 are connected in series between the line of power-supply potential VDD and node N21. Output signal VOP of latch circuit 29 is input into the gate of P-channel MOS transistor 72 via inverter 74. The gate of P-channel MOS transistor 73 is connected to node N22. The gate of N-channel MOS transistor 24 receives reference potential VR. A sum of the sizes of P-channel MOS transistors 21 and 73 is larger than the size of P-channel MOS transistor 22. The size of P-channel MOS transistor 72 is sufficiently larger than the size of P-channel MOS transistor 73.

If signal VOP is at the "L" level, P-channel MOS transistor 72 is rendered non-conductive, and only the two P-channel MOS transistors 21, 22 form a current mirror circuit. Here, the size of P-channel MOS transistor 21 is smaller than the size of P-channel MOS transistor 22, so that the current flowing in P-channel MOS transistor 21 is lower than the current flowing in P-channel MOS transistor 22. In other words, a current ratio (mirror ratio) of the current mirror circuit constituted by P-channel MOS transistors 21, 22, 72 and 73 becomes lower than 1, reducing the current flowing in P-channel MOS transistor 21. Accordingly, the same effect can be obtained as that in input circuit 14 shown in FIG. 3 where reference potential VRD is lowered to reduce the current flowing in P-channel MOS transistor 21.

If signal VOP is at the "H" level, P-channel MOS transistor 72 is rendered conductive, and a current mirror circuit is formed by P-channel MOS transistors 21, 22 and 73. Here, the sum of the sizes of P-channel MOS transistors 21 and 73 is larger than the size of P-channel MOS transistor 22, so that the sum of the current flowing in P-channel MOS transistors 21 and 73 is larger than the current flowing in P-channel MOS transistor 22. In other words, the current ratio of the current mirror circuit constituted by P-channel MOS transistors 21, 22, 72 and 73 is higher than 1, increasing the current flowing in P-channel MOS transistor 21. Thus, the same effect can be obtained as that in input circuit 14 shown in FIG. 3 where reference potential VRD is raised to increase the current flowing in P-channel MOS transistor 21.

In the fifth embodiment, the ratio of transistor sizes in the current mirror circuit is changed in accordance with the logic level of input signal VI in the preceding cycle, so that the logic level of input signal VI can accurately be determined irrespective of a high operating frequency.

[Sixth Embodiment]

Figure 18:
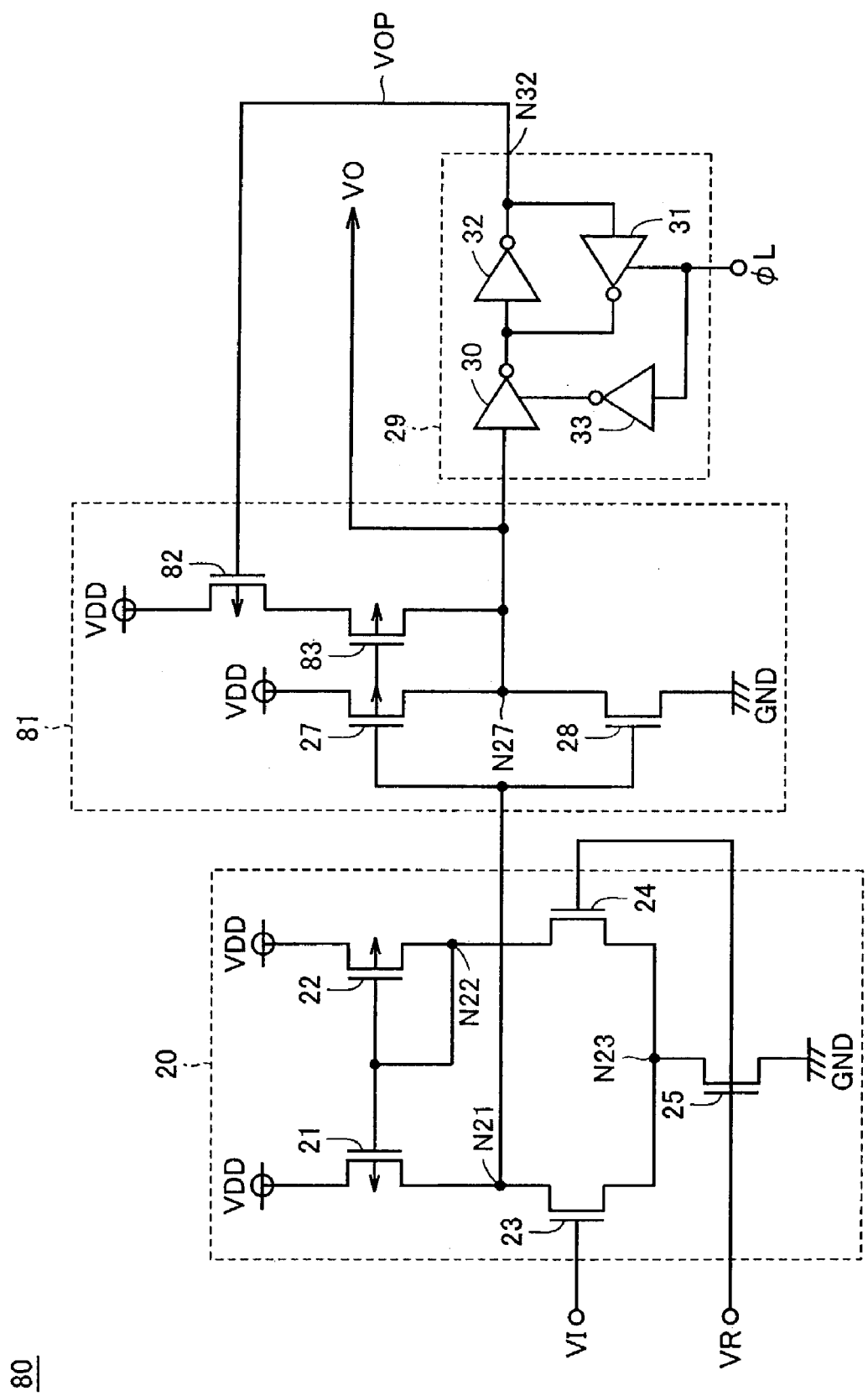
FIG. 18 is a circuit diagram illustrating the configuration of an input circuit according to the sixth embodiment of the present invention.

FIG. 18 is a circuit diagram illustrating the configuration of an input circuit 80 according to the sixth embodiment of the present invention. Referring to FIG. 18, input circuit 80 is different from input circuit 14 in FIG. 3 in that resistive elements 34, 35 are removed and inverter 26 is replaced by an inverter 81.

Inverter 81 is formed by adding P-channel MOS transistors 82, 83 to inverter 26, and by setting a conduction resistance value R27 of P-channel MOS transistor 27 to be higher than a conduction resistance value R28 of N-channel MOS transistor 28. P-channel MOS transistors 82, 83 are connected in series between the line of power-supply potential VDD and node N27. The gate of P-channel MOS transistor 82 receives output signal VOP of latch circuit 29. The gate of P-channel MOS transistor 83 is connected to the gate of P-channel MOS transistor 27. A conduction resistance value R27×R83/(R27+R83) of P-channel MOS transistors 27, 83 is lower than conduction resistance value R28 of N-channel MOS transistor 28. A conduction resistance value R82 of P-channel MOS transistor 82 is sufficiently lower than a conduction resistance value R83 of P-channel MOS transistor 83. The gate of N-channel MOS transistor 24 receives reference potential VR.

If signal VOP is at the "L" level, P-channel MOS transistor 82 is rendered conductive, and thus inverter 81 is constituted by P-channel MOS transistors 27, 83 and N-channel MOS transistor 28. Here, conduction resistance value R27×R83/(R27+R83) of P-channel MOS transistors 27 and 83 connected in parallel is lower than conduction resistance value R28 of N-channel MOS transistor 28, so that threshold potential VTH of inverter 81 is higher than VDD/2. Accordingly, the same effect can be obtained as that in input circuit 14 shown in FIG. 3 where reference potential VRD is lowered such that differential inversion operation is performed with a low potential of input signal VI.

If signal VOP is at the "H" level, P-channel MOS transistor 82 is rendered non-conductive, and thus inverter 81 is constituted by P-channel MOS transistor 27 and N-channel MOS transistor 28. Here, conduction resistance value R27 of P-channel MOS transistor 27 is higher than conduction resistance value R28 of N-channel MOS transistor 28, so that threshold potential VTH of inverter 81 is lower than VDD/2. Accordingly, the same effect can be obtained as that in input circuit 14 shown in FIG. 3 where reference potential VRD is raised such that differential inversion operation is performed with a high potential of input signal VI.

In the sixth embodiment, threshold potential VTH of inverter 81 is switched in accordance with the logic level of input signal VI in the preceding cycle, so that the logic level of input signal VI can accurately be determined irrespective of a high operating frequency.

[Seventh Embodiment]

Figure 19:
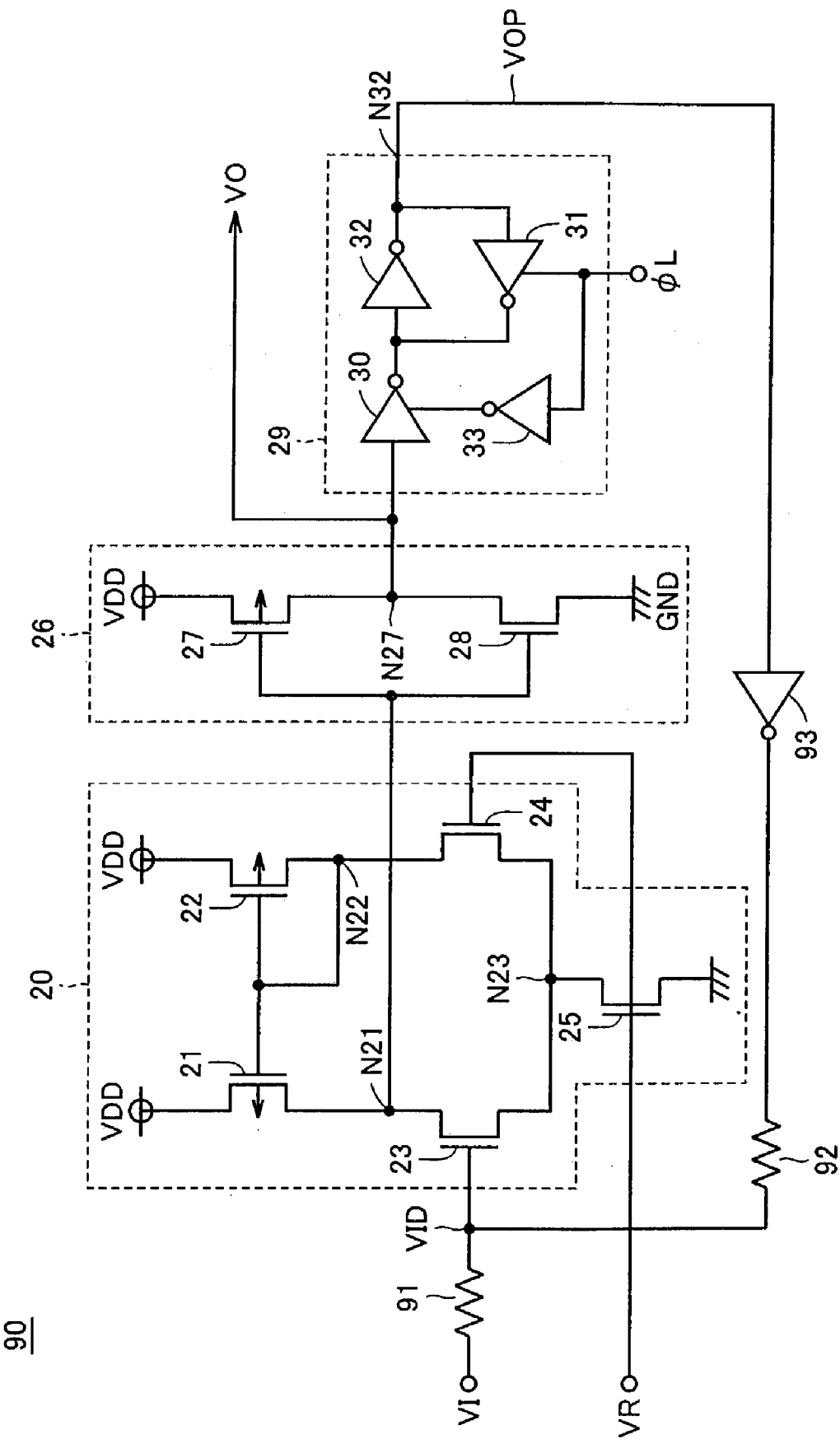
FIG. 19 is a circuit diagram illustrating the configuration of an input circuit according to the seventh embodiment of the present invention.

FIG. 19 is a circuit diagram illustrating the configuration of an input circuit 90 according to the seventh embodiment of the present invention. Referring to FIG. 19, input circuit 90 is different from input circuit 14 in FIG. 3 in that resistive elements 34, 35 are removed, and resistive elements 91, 92 and an inverter 93 are added.

Input signal VI is applied to the gate of N-channel MOS transistor 23 via resistive element 91. Inverter 93 and resistive element 92 are connected in series between output node N32 of latch circuit 29 and the gate of N-channel MOS transistor 23. A ratio R91:R92 of a resistance value R91 of resistive element 91 to a resistance value R92 of resistive element 92 is set as 1:9 in the description below, though not particularly limited thereto. The gate of N-channel MOS transistor 24 receives reference potential VR.

If signal VOP is at the "L" level, the output node of inverter 93 is set to the "H" level (power-supply potential VDD=1.8V). Moreover, as shown in FIG. 4, the "H" level and the "L" level of input signal VI are approximately 1.1V and approximately 0.5V, respectively. Accordingly, the "H" level of signal VID appearing at the gate of N-channel MOS transistor 23 corresponds to 1.1+(1.8−1.1)/10=1.17V, whereas the "L" level of signal VID corresponds to 0.5+(1.8−0.5)/10=0.63V. Here, VIH, VIL of differential amplifier circuit 20 are 1.15V, 0.65V, respectively, determining the output level of differential amplifier circuit 20.

If signal VOP is at the "H" level, the output node of inverter 93 has the "L" level (ground potential GND=0V). Moreover, as shown in FIG. 5, the "H" level and the "L" level of input signal VI are approximately 1.3V and approximately 0.7V, respectively. Accordingly, the "H" level of signal VID corresponds to 1.3×9/10=1.17V, whereas the "L" level of signal VID corresponds to 0.7×9/10=0.63V. Here, VIH and VIL of differential amplifier circuit 20 are 1.15V and 0.65V, respectively, which determine the output level of differential amplifier circuit 20.

Figure 20:
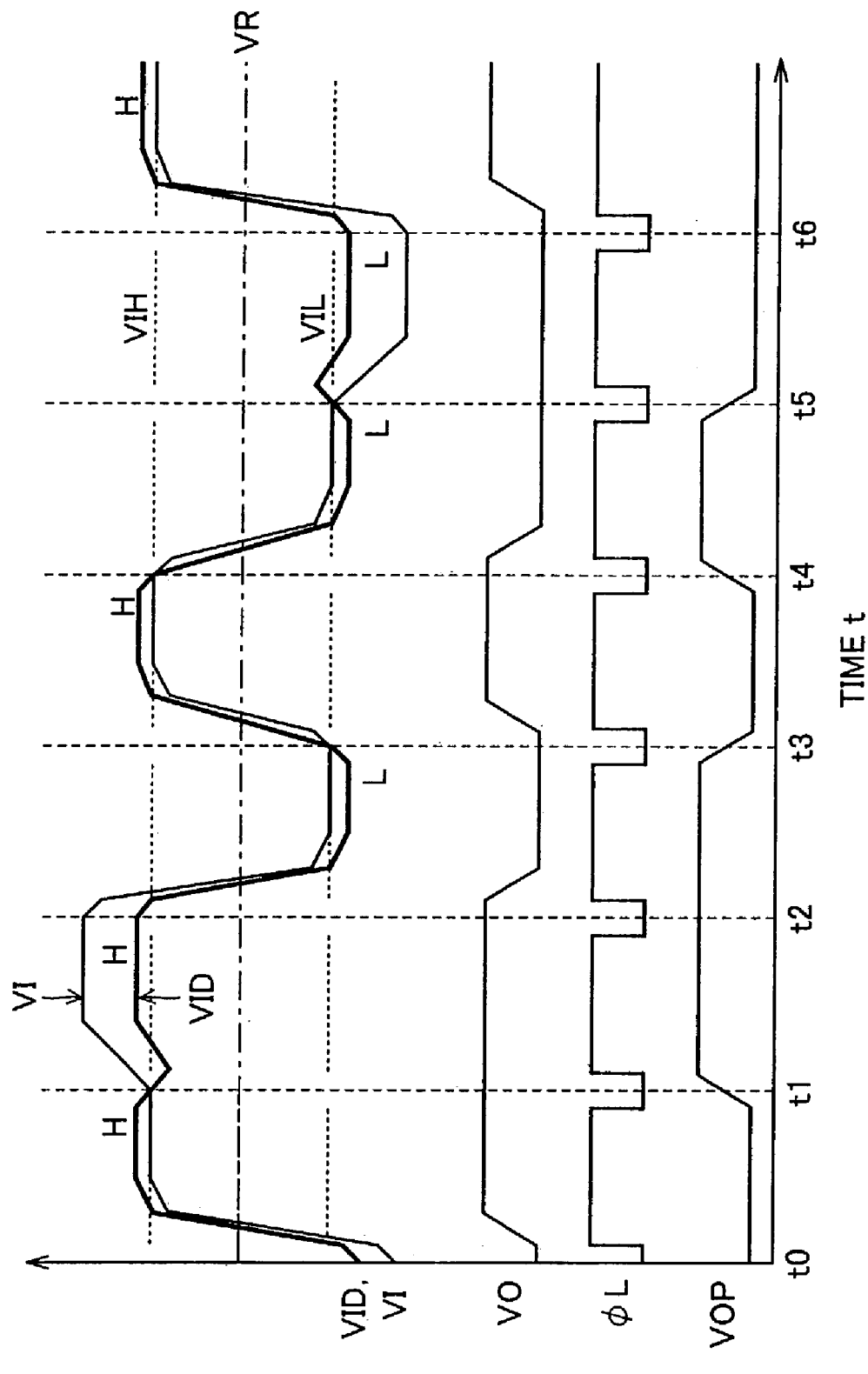
FIG. 20 is a time chart illustrating the operation of the input circuit shown in FIG. 19.

FIG. 20 is a time chart illustrating the operation of input circuit 90. It can be seen from FIG. 20 that the "H" level of signal VID can be higher than VIH, whereas the "L" level of signal VID can be lower than VIL.

In the seventh embodiment, the potential of input signal VID is adjusted in accordance with the logic level of input signal VI in a preceding cycle, so that the logic level of input signal VI can accurately be determined irrespective of a high operating frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A level determination circuit determining a logic level of an input signal for each of a plurality of periods, each period defined by a clock signal, comprising:

a comparison circuit for comparing a potential of said input signal with a reference potential used for comparison of said input signal to output a signal of a logic level corresponding to a result of the comparison; and a setting circuit operative in response to said input signal of a first potential level being received in an Nth period (N being a natural number) for setting said reference potential's level in an (N+1)th period to a second potential level, operative in response to said input signal of a potential level higher than said first potential level being received in said Nth period for setting said reference potential's level in said (N+1)th period to a potential level equal to or higher than said second potential level, and operative in response to said input signal of a potential level lower than said first potential level being received in said Nth period for setting said reference potential's level in said (N+1)th period to a potential level equal to or lower than said second potential level.

2. The level determination circuit according to claim 1, wherein
said setting circuit holds a signal corresponding to a signal output from said comparison circuit in said Nth period and sets said reference potential's level, as based on said signal held, in said (N+1) period.

3. The level determination circuit according to claim 1, wherein
said comparison circuit includes
a plurality of sub comparison circuits provided in correspondence to a plurality of reference potentials, respectively, each of which compares a potential of said input signal with a corresponding one of reference potentials to output a signal of a logic level corresponding to a result of the comparison, and
a switching circuit selecting any one of said plurality of sub comparison circuits in accordance with a selection signal such that an output signal of the selected sub comparison circuit is output as an output signal of said comparison circuit; and
said setting circuit includes a delay circuit delaying an output signal of said comparison circuit by one period to generate said selection signal.

4. The level determination circuit according to claim 3, wherein
said plurality of sub comparison circuits include a plurality of differential amplifier circuits each amplifying a potential difference between a potential of said input signal and each of said plurality of reference potentials different from each other.

5. The level determination circuit according to claim 1, wherein
said comparison circuit includes a differential amplifier circuit having a first current source supplying current corresponding to a potential of said input signal and a second current source supplying current corresponding to said reference potential, and amplifying a potential difference between the potential of said input signal and said reference potential, and
said setting circuit sets a difference in current drivability between said first and second current sources in a succeeding period to any one of a plurality of values.

6. The level determination circuit according to claim 5, wherein
said first current source includes a first transistor having its gate receiving said input signal;
said second current source includes a second transistor having its gate receiving said reference potential; and
said setting circuit includes
a delay circuit delaying an output signal of said comparison circuit by one period, and
a potential difference setting circuit setting a difference in a substrate potential between said first and second transistors to any one of a plurality of potential differences.

7. The level determination circuit according to claim 5, wherein said first current source includes a first transistor supplying current corresponding to the potential of said input signal;
said second current source includes
a second transistor supplying current corresponding to said reference potential, and
a current mirror circuit outputting current corresponding to the current flowing in said second transistor; and
said setting circuit includes
a delay circuit delaying an output signal of said comparison circuit by one period, and
a current ratio setting circuit setting a current ratio of said current mirror circuit to any one of a plurality of values in accordance with an output signal of said delay circuit.

8. The level determination circuit according to claim 1, wherein
said comparison circuit includes
a differential amplifier circuit amplifying a potential difference between a potential of said input signal and said reference potential, and
an inverter outputting an inversion signal of an output signal of said differential amplifier circuit; and
said setting circuit includes
a delay circuit delaying an output signal of said comparison circuit by one period, and a potential setting circuit setting a reference potential of said inverter to any one of a plurality of potentials in accordance with an output signal of said delay circuit.

9. A level determination circuit determining a logic level of an input signal for each of a plurality of periods, each period corresponding to one clock cycle of a clock signal, comprising:
a comparison circuit for comparing a potential of said input signal with a reference potential used for comparison of said input signal to output a signal of a logic level corresponding to a result of the comparison; and
a setting circuit operative in response to said input signal of a first potential level being received in an Nth period (N being a natural number) higher than a potential level for setting said reference potential's level in an (N+1)th period to a second potential level higher than said potential level, and operative in response to said input signal of a third potential level being received in said Nth period lower than said potential level for setting said reference potential's level in said (N+1)th period to a fourth potential level lower than said potential level.

10. The level determination circuit according to claim 9, wherein said setting circuit delays a signal corresponding to a signal output from said comparison circuit in said Nth period and sets said reference potential's level, as based on said signal delayed, in said (N+1) period.

11. The level determination circuit according to claim 9, wherein said setting circuit holds a signal corresponding to a signal output from said comparison circuit in said Nth period and sets said reference potential's level, as based on said signal held, in said (N+1) period.

* * * * *